(12) United States Patent
Yeo et al.

(10) Patent No.: US 12,354,920 B2
(45) Date of Patent: Jul. 8, 2025

(54) METHOD OF FORMING OPTICAL PROXIMITY CORRECTION MODEL AND METHOD OF FABRICATING SEMICONDUCTOR DEVICE USING THE SAME

(71) Applicant: Samsung Electronics Co., Ltd., Suwon-si (KR)

(72) Inventors: Sang Chul Yeo, Osan-si (KR); Min-Cheol Kang, Hwaseong-si (KR); Sooryong Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 619 days.

(21) Appl. No.: 17/735,593

(22) Filed: May 3, 2022

(65) Prior Publication Data
US 2023/0062677 A1    Mar. 2, 2023

(30) Foreign Application Priority Data

Aug. 27, 2021    (KR) .................. 10-2021-0113960

(51) Int. Cl.
*H01L 21/66*    (2006.01)
*G01N 21/88*    (2006.01)
*G01N 21/84*    (2006.01)

(52) U.S. Cl.
CPC ......... *H01L 22/24* (2013.01); *G01N 21/8851* (2013.01); *H01L 22/12* (2013.01);
(Continued)

(58) Field of Classification Search
CPC ......... H01L 22/24; H01L 22/12; H01L 22/26; G01N 21/8851; G01N 2021/8461;
(Continued)

(56) References Cited

U.S. PATENT DOCUMENTS 8,196,068 B2    6/2012    Zhang
8,521,481 B2    8/2013    Tejnil
(Continued)

FOREIGN PATENT DOCUMENTS

KR    10-2020-0139800 A    12/2020

*Primary Examiner* — Paul Dinh
(74) *Attorney, Agent, or Firm* — HARNESS, DICKEY & PIERCE, P.L.C.

(57) ABSTRACT

Disclosed are a method of forming an optical proximity correction (OPC) model and/or a method of fabricating a semiconductor device using the same. The method of forming the OPC model may include obtaining a scanning electron microscope (SEM) image, which is an average image of a plurality of images taken using one or more scanning electron microscopes, and a graphic data system (GDS) image, which is obtained by imaging a designed layout, aligning the SEM image and the GDS image, performing an image filtering process on the SEM image, extracting a contour from the SEM image, and verifying the contour. The verifying of the contour may be performed using a genetic algorithm. Variables in the genetic algorithm may include first parameters related to the image alignment process, second parameters related to the image filtering process, and third parameters related to a critical dimension (CD) measurement process.

20 Claims, 18 Drawing Sheets

(52) U.S. Cl.
CPC ...... *H01L 22/26* (2013.01); *G01N 2021/8461* (2013.01); *G01N 2021/8883* (2013.01)

(58) Field of Classification Search
CPC ........ G01N 2021/8883; G03F 7/70625; G03F 7/70655; G03F 7/706841; G03F 7/70441; G03F 7/2004; G06F 30/392; G06F 30/398; H10B 12/02; H10B 41/27; H10B 43/27
USPC .......................................................... 716/53
See application file for complete search history.

(56) References Cited

U.S. PATENT DOCUMENTS

| | | | |
|---|---|---|---|
| 8,954,899 B2 | 2/2015 | Wu et al. | |
| 9,053,532 B2 | 6/2015 | Gabrani et al. | |
| 9,904,993 B2 | 2/2018 | Brill | |
| 2011/0184546 A1* | 7/2011 | Fan | G03F 7/70441 716/50 |
| 2012/0110522 A1* | 5/2012 | Bailey | G06F 30/398 716/53 |
| 2021/0035833 A1 | 2/2021 | Feng et al. | |

* cited by examiner

METHOD OF FORMING OPTICAL PROXIMITY CORRECTION MODEL AND METHOD OF FABRICATING SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application No. 10-2021-0113960, filed on Aug. 27, 2021, in the Korean Intellectual Property Office, the entire contents of which are hereby incorporated by reference.

BACKGROUND

Some example embodiments relate to a method of fabricating a semiconductor device, and in particular, to a method of forming an optical proximity correction (OPC) model and/or a method of fabricating a semiconductor device using the same.

Due to their small-sized, multifunctionality, and/or low-cost characteristics, semiconductor devices are being esteemed as important elements in the electronics industry. The semiconductor devices may be classified into a semiconductor memory device for storing data, a semiconductor logic device for processing data, and a hybrid semiconductor device including both of memory and logic elements. As the electronic industry advances, there is an increasing demand for semiconductor devices with improved characteristics. For example, there is an increasing demand for semiconductor devices with high reliability, high performance, and/or multiple functions. To meet or at least partially meet this demand, structural complexity and/or integration density of semiconductor devices are being increased.

SUMMARY

Some example embodiments provide a method of forming an optical proximity correction (OPC) model with improved accuracy and/or reliability, and/or a method of fabricating a semiconductor device using the same.

According to some example embodiments, a method of forming an optical proximity correction (OPC) model may include obtaining a scanning electron microscope (SEM) image, which is an average image of a plurality of images taken using one or more scanning electron microscopes, and a graphic data system (GDS) image, which is obtained by imaging a designed layout, aligning the SEM image and the GDS image, performing an image filtering process on the SEM image, extracting a contour from the SEM image, and verifying the contour. The verifying of the contour may be performed using a genetic algorithm. Variables in the genetic algorithm may include first parameters related to the image alignment process, second parameters related to the image filtering process, and third parameters related to a critical dimension (CD) measurement process.

According to some example embodiments, a method of fabricating a semiconductor device may include designing a layout, performing an optical proximity correction (OPC) process on the designed layout, and performing a photolithography process using a photomask, the photomask manufactured based on the corrected layout, the photolithography process forming photoresist patterns on a substrate. The OPC process may include forming an OPC model, correcting the OPC model based on a simulation result on the OPC model, and verifying the corrected OPC model. The forming of the OPC model may include obtaining a SEM image, which is an average image of a plurality of images on the photoresist pattern taken using a scanning electron microscope, and a GDS image, which is obtained by imaging the layout, aligning the SEM image and the GDS image, performing an image filtering process on the SEM image, extracting a contour from the SEM image, and verifying the contour. The verifying of the contour may be performed using a genetic algorithm.

DETAILED DESCRIPTION

A method of forming an optical proximity correction (OPC) model according to some example embodiments and/or a method of fabricating a semiconductor device using the same will now be described more fully with reference to the accompanying drawings, in which example embodiments are shown.

Figure 1:
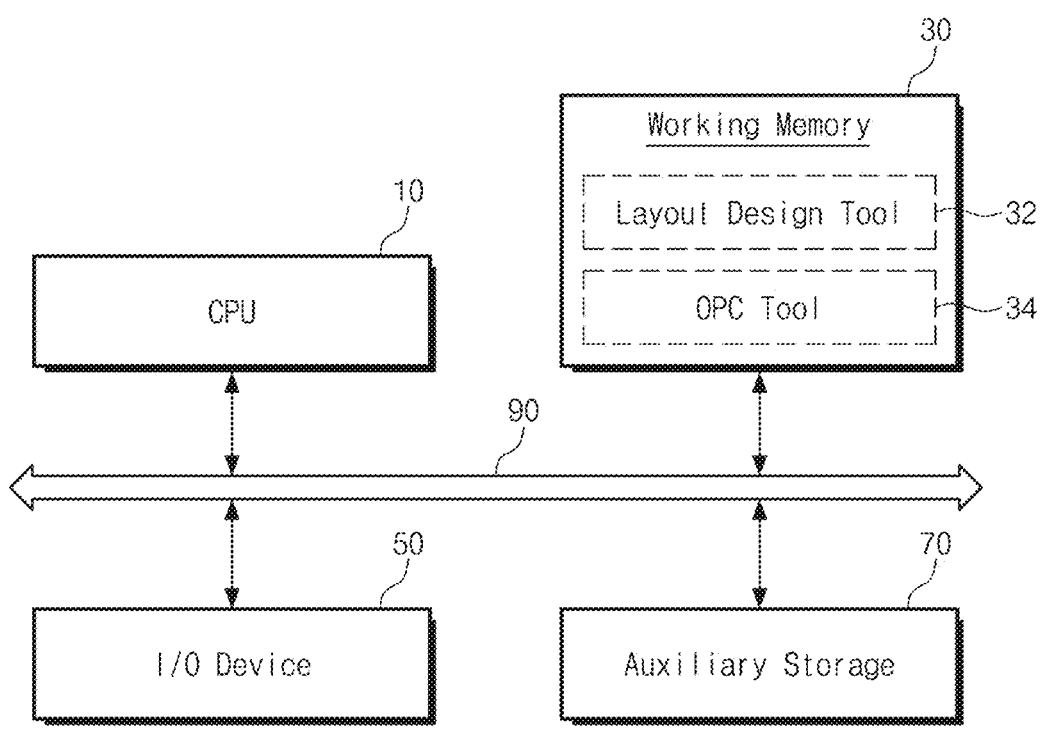
FIG. 1 is a block diagram illustrating a computer system, which is used to perform a semiconductor design process, according to some example embodiments.

FIG. 1 is a block diagram illustrating a computer system, which is used to perform a semiconductor design process, according to some example embodiments. Referring to FIG. 1, a computer system may include a central processing unit (CPU) 10, a working memory 30, an input-output unit 50, and an auxiliary storage 70. The computer system may be a generic system, or alternatively may be a system which is customized to perform a layout design process according to some example embodiments. Furthermore, the computer system may be configured to include various design, e.g. design-rule check (DRC) programs, and/or verify, e.g. layout-versus-schematic (LVS), simulation programs.

The CPU 10 may be configured to run a variety of software programs, such as one or more of application programs, an operating system, and device drivers, which will be executed in the computer system. For example, the CPU 10 may be configured to run an operating system (OS) (not shown) loaded on the working memory 30. Furthermore, the CPU 10 may be configured to run various application programs, which will be executed on the operating system (OS). For example, the CPU 10 may be configured to run a layout design tool 32 and/or an OPC tool 34 loaded on the working memory 30.

The operating system or application programs may be loaded on the working memory 30. For example, when the computer system starts a booting process, an image (not shown) of the operating system stored in the auxiliary storage 70 may be loaded on or in the working memory 30 in accordance with a booting sequence. Overall input/output operations of the computer system may be managed by the operating system (OS). An application program, which is chosen by a user and/or is provided for basic services, may be loaded on the working memory 30. For example, the layout design tool 32 and/or the OPC tool 34 may be loaded on the working memory 30 from the auxiliary storage 70.

The layout design tool 32 may provide a biasing function capable of changing specific layout patterns to have shapes and/or positions that are different from those defined by a design rule. The layout design tool 32 may perform a design rule check (DRC) under the changed condition for the bias data. The OPC tool 34 may perform an optical proximity correction (OPC) process on a layout data, which is output from the layout design tool 32. The OPC process may include, but is not limited to including, adding serifs/dogbones/in-riggers/outriggers and/or performing other adjustments on various polygons included in the layout. The working memory 30 may be one or more of volatile memory devices (e.g., static random access memory (SRAM) and/or dynamic random access memory (DRAM) devices) or non-volatile memory devices (e.g., one or more of PRAM, MRAM, ReRAM, FRAM, NOR FLASH memory devices).

The input-output unit 50 may be configured to control user's data to be input and output through a user interface device. For example, the input-output unit 50 may include a keyboard and/or a monitor which is used to receive relevant information from a designer. By using the input-output unit 50, it may be possible for the designer to receive information on semiconductor regions and/or data paths where adjusted operating characteristics are required/to be realized. The input-output unit 50 may be configured to display a progressive status and/or result of a process that is executed by the OPC tool 34.

The auxiliary storage 70 may be provided as a storage medium of the computer system. The auxiliary storage 70 may be used to store the application programs, the image of the operating system, and various kinds of data. The auxiliary storage 70 may include one of memory cards (e.g., one or more of MMC, eMMC, SD, MicroSD, and so forth), a hard disk drive (HDD), or a solid state drive (SSD). In some example embodiments, the auxiliary storage 70 may include a NAND FLASH memory device with a large memory capacity. In some example embodiments, the auxiliary storage 70 may include next-generation non-volatile memory devices (e.g., PRAM, MRAM, ReRAM, and FRAM devices) or a NOR FLASH memory device.

A system interconnector 90 may be a system bus provided for an internal network of the computer system. The CPU 10, the working memory 30, the input-output unit 50, and the auxiliary storage 70 may be electrically connected to each other through the system interconnector 90 to exchange data with each other. However, the structure of the system interconnector 90 may not be limited to this example, and in some example embodiments, the system interconnector 90 may further include an interconnection element provided for efficient management.

Figure 2:
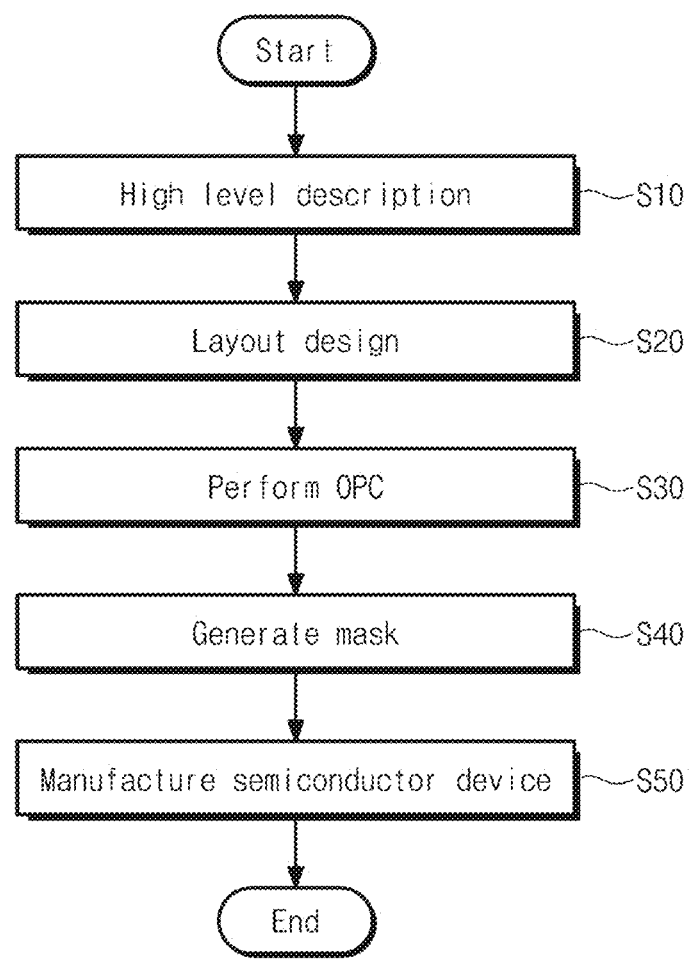
FIG. 2 is a flow chart illustrating a method of designing and fabricating a semiconductor device according to some example embodiments.

FIG. 2 is a flow chart illustrating a method of designing and fabricating a semiconductor device according to some example embodiments.

Referring to FIG. 2, a high-level design process of a semiconductor integrated circuit may be performed using the computer system described with reference to FIG. 1 (in S10). In the high-level design process, an integrated circuit to be designed may be described with high-level computer language. An example of the high-level computer language may be a C programming language; however, example embodiments are not limited thereto. Circuits designed by the high-level design process may be more concretely described by a register-transfer-level (RTL) coding or simulation. Furthermore, codes generated by the RTL coding may be converted into a netlist and/or may be combined to describe the entirety of, or at least a portion of, the semiconductor device. The combined schematic circuit may be verified by a simulation tool, and an adjusting step may be further performed based on a result of the verification step. Additional iterations may be performed; however, example embodiments are not limited thereto.

A layout design process may be performed to realize the logically-finalized semiconductor integrated circuit, for example on a wafer such as on a silicon wafer (in S20). For example, the layout design process may be performed, based on the schematic circuit prepared in the high-level design process and/or the corresponding netlist. The layout design process may include a routing step of placing and connecting various standard cells that are provided from a cell library, based on a predetermined (or, alternatively, dynamically determined) design rule.

The cell library for the layout design process may contain information on operation, speed, and power consumption of the standard cell. In some example embodiments, a cell library for representing a circuit of a specific gate level as a layout may be defined in most layout design tools. Here, the layout may be prepared to define shapes and/or sizes of patterns and/or polygons constituting transistors and/or routing lines such as metal lines, which may be actually formed on a wafer. For example, layout patterns (e.g., PMOS, NMOS, N-WELL, gate electrodes, and/or metal lines thereon) may be appropriately placed to form an inverter circuit on a wafer. For this, an appropriate inverter may be searched and chosen from inverters which had been previously defined in the cell library.

A routing step may be performed on the chosen and placed standard cells. In detail, the routing step may be performed to connect the chosen and placed standard cells to upper-level routing lines. As a result of the routing step, the standard cells may be connected to each other in a designed manner. The afore-described steps may be at least partially automatically or at least partially manually performed by most layout design tools. In addition, the step of placing and routing the standard cells may be automatically performed using an additional Place & Routing (P&R) tool.

After the routing step, a verification step on the layout may be performed to check whether there is a portion violating the given design rule. In some example embodiments, the verification step may include evaluating verification items, such as one or more of a design rule check (DRC), an electronical rule check (ERC), and a layout vs schematic (LVS). The evaluating of the DRC item may be performed to evaluate whether the layout meets the given design rule. The evaluating of the ERC item may be performed to evaluate whether there is or may be an issue of electrical disconnection in the layout. The evaluating of the LVS item may be performed to evaluate whether the layout is prepared to coincide with the gate-level netlist.

An optical proximity correction (OPC) process may be performed (in S30). There may be other processes, such as for example dummy-fill processes, performed prior to or after the OPC process; however, example embodiments are not limited thereto. Layout patterns, which are prepared by the layout design process, may be realized on a wafer through a photolithography process. The OPC process may be performed to correct or improve upon an optical proximity and/or distortion effect, which may occur in the photolithography process. For example, by performing the OPC process, it may be possible to correct or improve upon optical effects (e.g., refraction) and/or process effects, which may occur in an exposure step using a layout pattern. As a result of the OPC process, the shapes and/or positions of patterns in the designed layout may be changed or biased. The OPC process will be described in more detail with reference to FIGS. 3 to 8.

A photomask may be manufactured, based on the layout modified by the OPC process (in S40). In some example embodiments, the photomask may be manufactured by patterning a chromium layer, which is formed on a glass substrate, to depict the layout patterns; however, example embodiments are not limited thereto. Furthermore the photomask may be a negative photomask, or a positive photomask; example embodiments are not limited thereto.

The manufactured photomask may be used to manufacture a semiconductor device (in S50). In the actual fabricating process using the photomask, various exposing and/or etching steps may be repeatedly performed, with the same, or with different, photomasks. As a result of these steps, patterns may be sequentially formed on a wafer to have shapes and arrangements defined by the layout design process.

Figure 3:
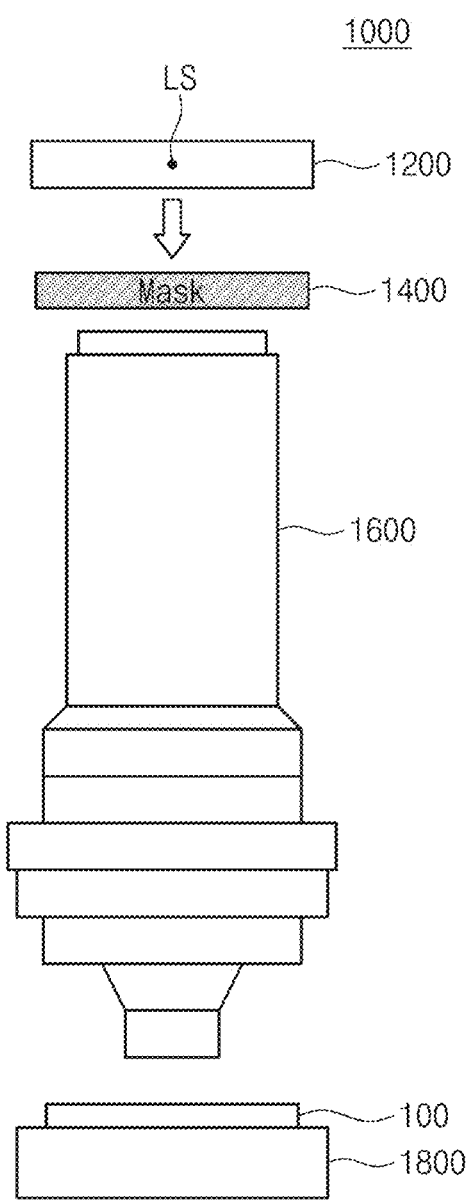
FIG. 3 is a conceptual diagram illustrating a photolithography system using a manufactured photomask according to some example embodiments.

FIG. 3 is a conceptual diagram illustrating a photolithography system using a manufactured photomask according to some example embodiments. A photolithography system 1000 may include a light source 1200, a photomask 1400, a reduction projection apparatus 1600, and a substrate stage 1800. Although not illustrated in FIG. 3, some additional elements may be provided in the photolithography system 1000. For example, the photolithography system 1000 may further include a sensor, which is used to measure a height and a slope of a top surface of a substrate 100.

The light source 1200 may be configured to emit light. The light emitted from the light source 1200 may be incident into the photomask 1400. To control a focal length, a lens may be provided between the light source 1200 and the photomask 1400. The light source 1200 may be configured to emit an ultraviolet light; for example, the light source 1200 may be one or more of a KrF light source emitting light of 234 nm, an ArF light source emitting light of 193 nm, or an extreme ultraviolet (EUV) light source. In some example embodiments, the light source 1200 according to some example embodiments may be the EUV light source.

The EUV light may have a wavelength ranging from 4 nm to 124 nm and, in particular, from 4 nm to 20 nm and may be, for example, an ultraviolet light having a wavelength of 13.5 nm. For example, based on Planck's relation, the EUV light may have an energy of 6.21 eV to 124 eV (in particular, 90 eV to 95 eV).

The light source 1200 may include a single point light source LS, but the inventive concept is not limited to this example. In some example embodiments, the light source 1200 may include a plurality of point light sources.

The photomask 1400 may include image patterns, which are used to print and/or realize a designed layout on the substrate 100. The image patterns may be formed with a positive patterning process, or with a negative patterning process; example embodiments are not limited thereto. The image patterns may be formed, based on the layout patterns prepared through the layout design process and the OPC process described above. The image patterns may be defined by transparent and opaque regions. The transparent region may be formed by etching a metal layer (e.g., a chromium layer) that is provided on the photomask 1400. The transparent region may be configured to transmit light, which is emitted from the light source 1200. By contrast, the opaque region may be configured to prevent or block the light.

Light passing through the transparent region of the photomask 1400 may be incident into the reduction projection apparatus 1600. The reduction projection apparatus 1600 may be configured to match patterns, which will be printed on the substrate 100, with the image patterns of the photomask 1400. The light may be incident into the substrate 100 through the reduction projection apparatus 1600. Accordingly, patterns corresponding to the image patterns of the photomask 1400 may be printed on the substrate 100.

The substrate stage 1800 may support the substrate 100. As an example, the substrate 100 may include a wafer such as a silicon wafer. The reduction projection apparatus 1600 may include an aperture. The aperture may be used to increase a depth of focus for the ultraviolet light emitted from the light source 1200. As an example, the aperture may include a dipole and/or quadruple aperture. The reduction projection apparatus 1600 may further include a lens for controlling a focal length.

As an integration density of a semiconductor device increases, a distance between the image patterns of the photomask 1400 may be reduced, and due to such a proximity issue, interference and/or diffraction issues may occur. As a result of the proximity issue, the photoresist patterns formed on the substrate 100 may have distorted shapes (e.g., different from those of the image patterns of the photomask 1400). The distortion of the photoresist patterns may lead to malfunction of an electronic device or circuit to be formed on the substrate 100.

A resolution enhancement technology (RET) may be used to prevent or reduce the likelihood of and/or impact from the distortion of the patterns. An OPC technology, which is used in the step S30 of FIG. 2, may be an example of the resolution enhancement technology. According to the OPC technology, the optical distortion issue, which is caused by interference and diffraction, may be predicted by a simulation process using an OPC model. The designed layout may be corrected and/or biased, based on the predicted result. The image patterns may be formed on the photomask 1400, based on the corrected layout, and thus, desired patterns may be printed on the substrate 100.

A layout of a semiconductor device may include a plurality of layers. In some example embodiments, the OPC step may be performed to correct a layout for each of the layers. For example, the OPC step may be independently performed on each of the layers. A semiconductor device may be fabricated by realizing the plurality of layers on a substrate through a semiconductor process. As an example, the semiconductor device may include a plurality of metal layers and/or a plurality of contact layers and/or a plurality of via layers, which are stacked to realize a specific circuit. In some example embodiments, each of the plurality of layers may correspond to different photomasks; however, example embodiments are not limited thereto.

Figure 4:
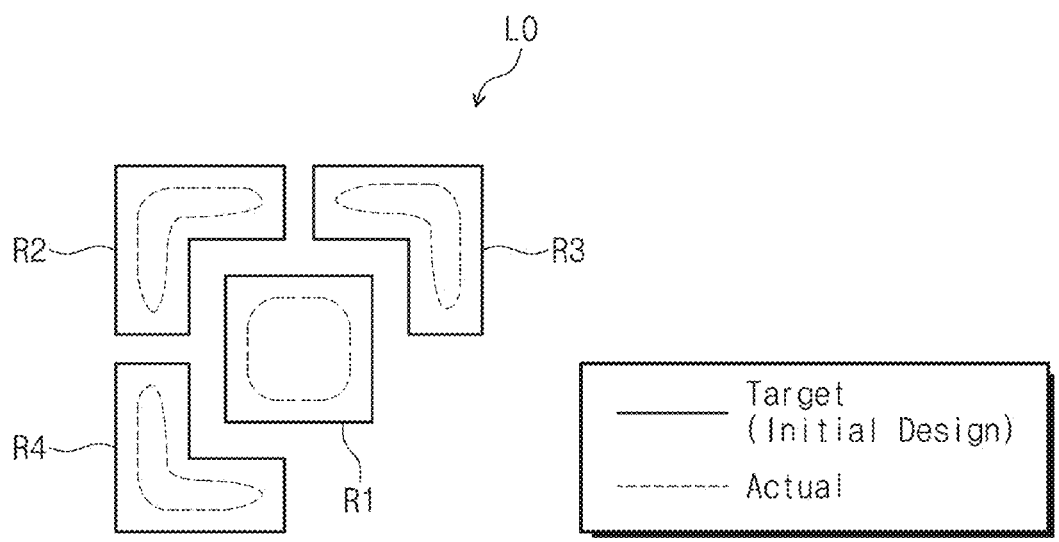
FIG. 4 is a conceptual diagram illustrating a layout according to some example embodiments.

FIG. 4 is a conceptual diagram illustrating a layout according to some example embodiments. In FIG. 4, a solid line depicts target patterns that are desired to be formed on the substrate 100 of FIG. 3, and a dotted line depicts actual patterns that are actually formed on the substrate 100 of FIG. 3.

A designed layout LO may include first to fourth circuit patterns R1, R2, R3, and R4. In order to reduce complexity in the drawings and to provide better understanding of inventive concepts, an example of a shape of the designed layout LO is illustrated in FIG. 4, but example embodiments are not limited thereto. The designed layout LO may be provided as an initial design layout. The first to fourth circuit patterns R1, R2, R3, and R4, which are depicted by the solid lines in FIG. 4, may illustrate the target patterns that are desired to be formed on the substrate 100.

As described above, owing to optical distortion issues caused by interference and/or diffraction, photoresist patterns on the substrate 100 may have shapes different from those in the designed layout LO. For example, even when the image patterns of the photomask 1400 are formed to have shapes depicted by the solid lines of FIG. 4, the first to fourth circuit patterns R1, R2, R3, and R4 to be formed on the substrate 100 may have distorted shapes that are depicted by the dotted lines of FIG. 4. In this case, a circuit formed on the substrate 100 may abnormally operate.

An OPC step may be performed to prevent, or reduce the likelihood of and/or impact from, the distortion of the patterns. For example, to reduce a difference between the actual pattern (depicted by the dotted line of FIG. 4) and the target pattern (depicted by the solid line of FIG. 4), the designed layout LO may be biased through the OPC step. The image patterns of the photomask 1400 may be formed, based on the biased layout. In the case where the photomask 1400 manufactured through this process is used for a photolithography process, the actual patterns printed on the substrate 100 may have similar or substantially the same shapes as those of the first to fourth circuit patterns R1, R2, R3, and R4 defined in the designed layout LO.

Figure 5:
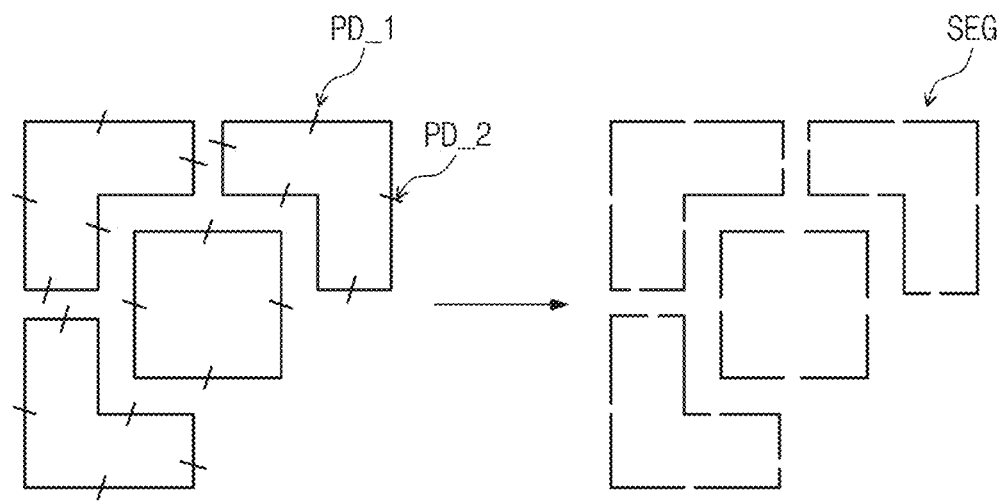
FIG. 5 is a conceptual diagram illustrating a process of dividing a contour of a designed layout of FIG. 4 into a plurality of segments, in an optical proximity correction (OPC) process.

FIG. 5 is a conceptual diagram illustrating a process of dividing a contour of a designed layout of FIG. 4 into a plurality of segments, in an optical proximity correction (OPC) process. Referring to FIG. 5, a plurality of division points may be set on a contour of a designed layout. As an example, a first division point PD_1 and a second division point PD_2 may be set on the contour of the designed layout.

One segment SEG may be obtained, based on the first division point PD_1 and the second division point PD_2. The contour of the designed layout may be divided into a plurality of segments in a similar manner, based on a plurality of division points.

As used herein, the term "division" may not mean a physical division. Furthermore, although a plurality of segments are illustrated in FIG. 5 as if they were physically spaced apart from each other, FIG. 5 is just a schematic diagram that is presented for the purpose of providing better understanding of various example embodiments.

In the OPC step, each of the divided segments SEG may be an object, to which the biasing process will be applied. Each of the divided segments SEG may be independently biased. For example, one of the segments SEG may be biased in a first direction (e.g., a positive or outward direction) or a second direction (e.g., a negative or inward direction), independent of the others of the segments SEG. Each of the divided segments SEG may be biased to reduce a difference in shape and/or size between the actual and target patterns. The biasing of the divided segments SEG may be performed by the OPC tool 34 of FIG. 1. An example of a corrected layout, which is obtained based on the biased segments, is illustrated in FIG. 6.

Figure 6:
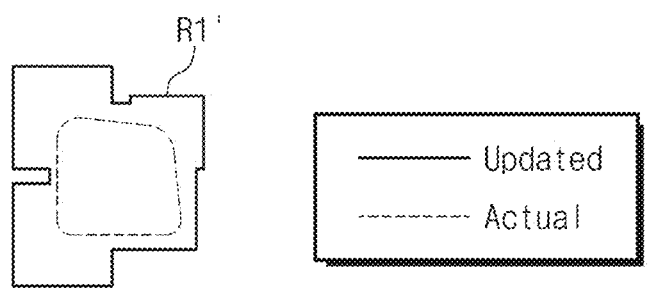
FIG. 6 is a conceptual diagram illustrating a layout that is corrected by the OPC process of FIG. 5.

FIG. 6 is a conceptual diagram illustrating a layout that is corrected by the OPC process of FIG. 5. Referring to FIG. 6, a first correction pattern R1', which is corrected from the first circuit pattern R1 of FIG. 4, may be provided. For convenience in illustration, the second to fourth circuit patterns R2, R3, and R4 of FIG. 4 are omitted from FIG. 6. As previously described with reference to FIG. 5, the contour of the first circuit pattern R1 of FIG. 4 may be divided into a plurality of segments, and each of the divided segments may be biased. As illustrated in FIG. 6, each of the segments may be biased in one of the first direction (e.g., the positive or outward direction) and the second direction (e.g., the negative or inward direction). In some example embodiments, at least one of the segments may not be biased. FIG. 6 show an example of the first correction pattern R1' that is obtained as a result of the biasing.

The dotted line of FIG. 6 depicts an actual pattern, which will be actually formed on the substrate 100 of FIG. 3 when the corrected layout is used. By biasing each of the divided segments, it may be possible to reduce a difference in shape and/or size between the actual pattern and the target pattern.

Figure 7:
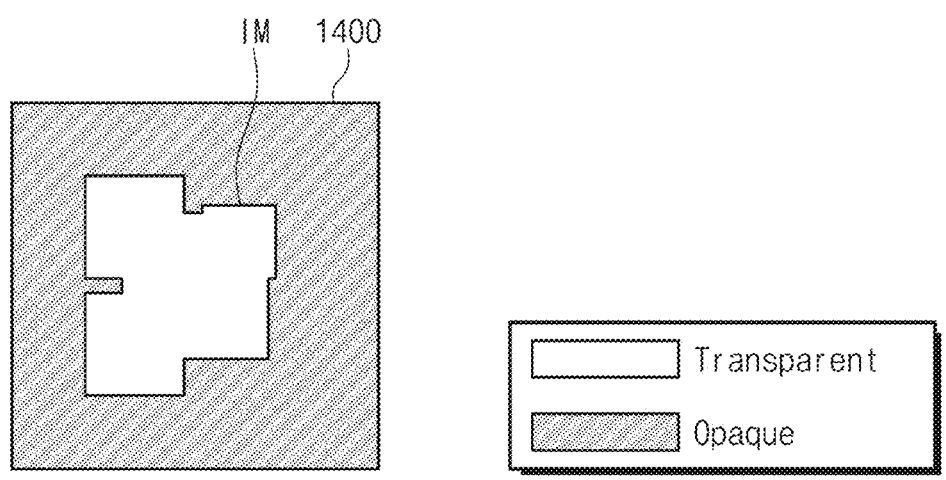
FIG. 7 is a conceptual diagram illustrating a photomask which is manufactured based on the corrected layout of FIG. 6.

FIG. 7 is a conceptual diagram illustrating a photomask which is manufactured based on the corrected layout of FIG. 6. As an example, referring to FIG. 7, the photomask 1400 may include an image pattern IM corresponding to the first correction pattern R1' of FIG. 6. The photomask 1400 may include a transparent region and an opaque region. The opaque region may be configured to prevent or reduce or at least partially reduce light from passing therethrough or to fully or at least partially block the light. By contrast, the transparent region may be configured to transmit all of, or at least a majority of, the light, which is emitted from the light source 1200 of FIG. 3. Light passing through the photomask 1400 may be incident into a photoresist layer on the substrate 100 of FIG. 3. For example, in the case where a negative photoresist layer is used in the photolithography process, the image pattern IM may be the transparent region of the photomask 1400.

Figure 8:
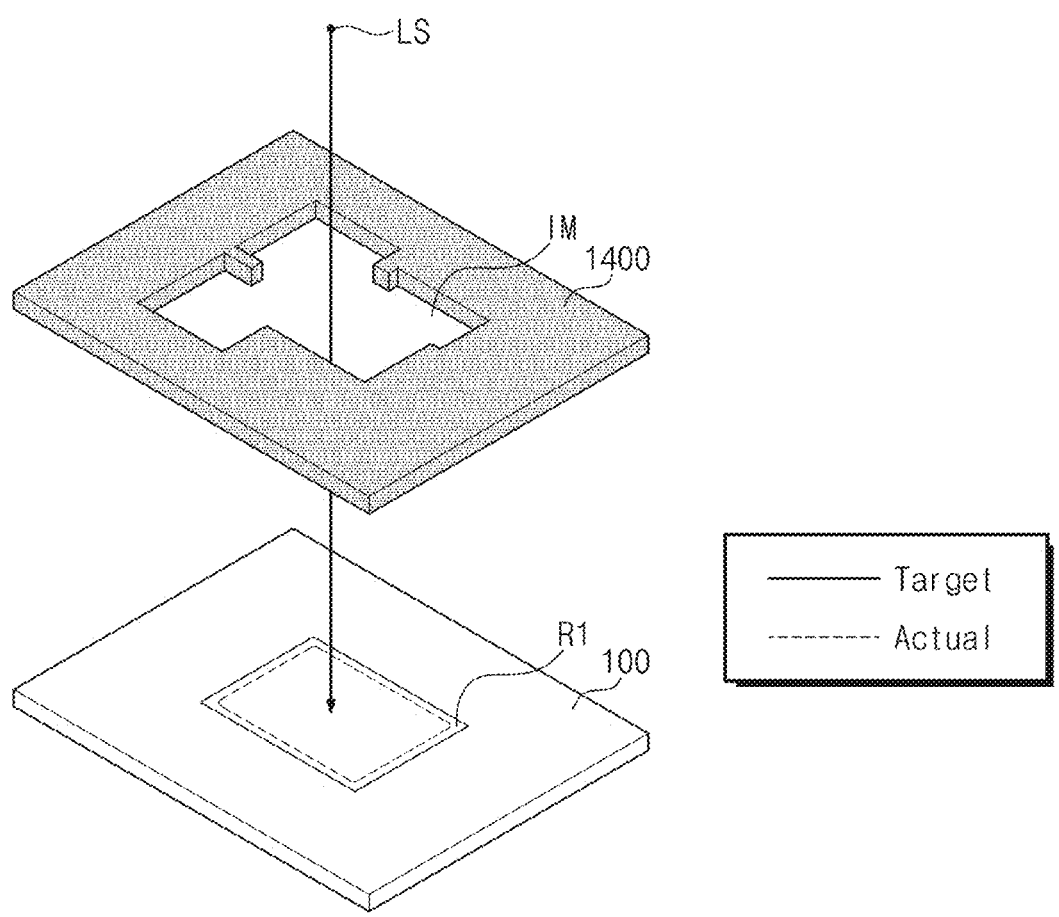
FIG. 8 is a conceptual diagram illustrating a process of printing a circuit pattern on a substrate using the photomask of FIG. 7.

FIG. 8 is a conceptual diagram illustrating a process of printing a circuit pattern on a substrate using the photomask of FIG. 7. The point light source LS of the light source 1200 of FIG. 3 may emit light to/through the photomask 1400. In an exposure step, the emitted light may pass through the transparent region of the image pattern IM and then may be incident into the photoresist layer on the substrate 100. In a subsequent developing step, a region of the photoresist layer, which is exposed to the light, may remain, and another region of the photoresist layer, which is not exposed to the light, may be removed. Accordingly, the first circuit pattern R1 corresponding to the image pattern IM may be printed/patterned on the substrate 100.

In the case of the photolithography process using extreme ultraviolet (EUV) light, a photoresist layer or a photoresist pattern may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer or the photoresist pattern may be an inorganic photoresist layer containing an inorganic material (e.g., tin oxide).

An actual pattern may be printed on the substrate 100 to have a shape depicted by the dotted line. The actual pattern may have substantially the same shape and/or size as the target pattern depicted by the solid line. For example, by performing the afore-described OPC process, it may be possible to reduce a difference in shape and/or size between the actual and target patterns.

Figure 9:
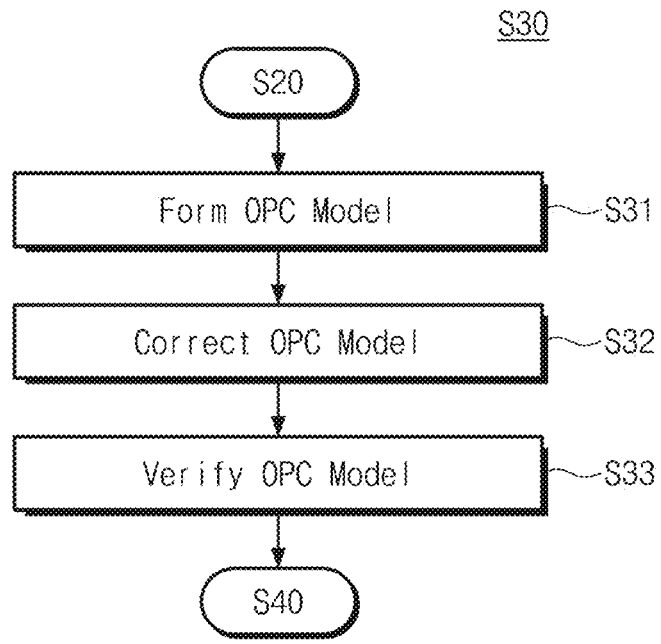
FIGS. 9, 10, and 12 are flow charts illustrating an OPC process according to some example embodiments and some steps thereof.
Figure 10:
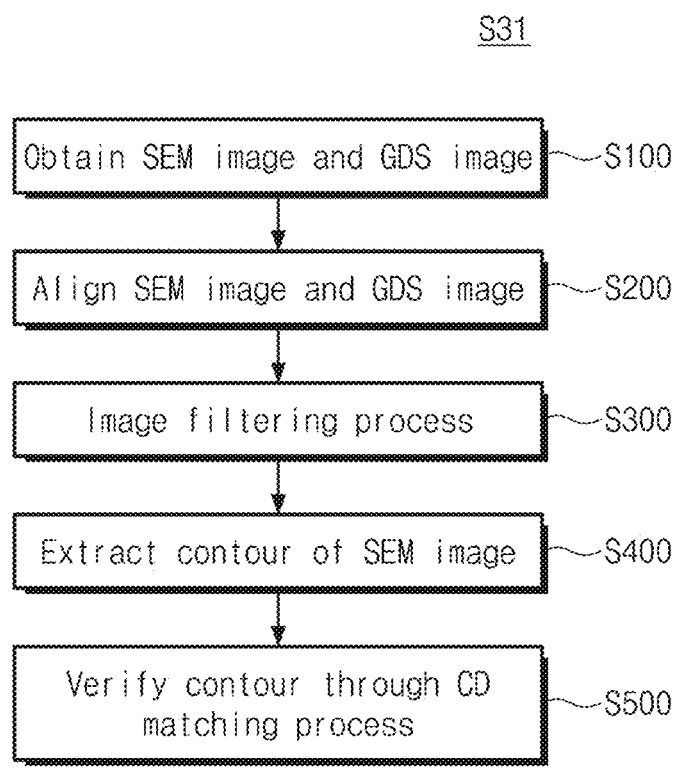
Figure 11A:
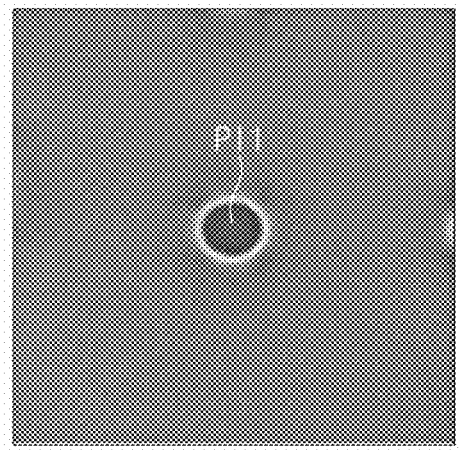
FIGS. 11A to 11D are conceptual diagrams illustrating an image filtering process, which is performed as a part of an OPC process according to some example embodiments.
Figure 11B:
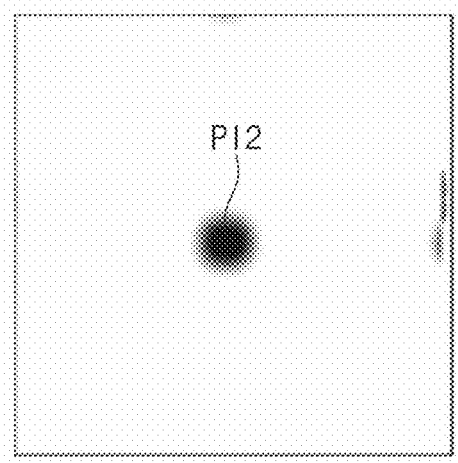
Figure 11C:
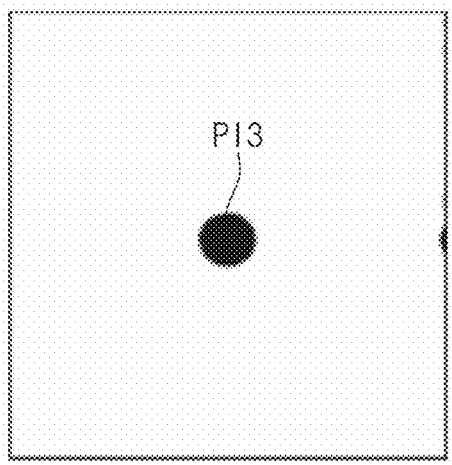
Figure 11D:
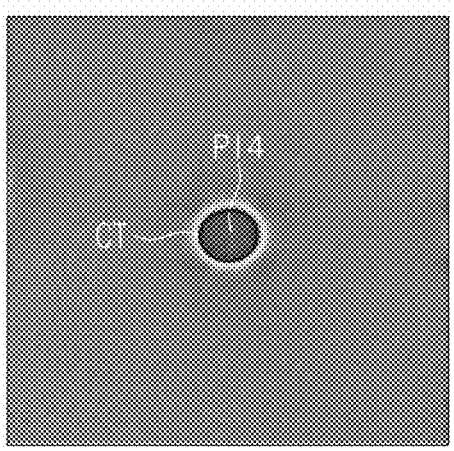
Figure 12:
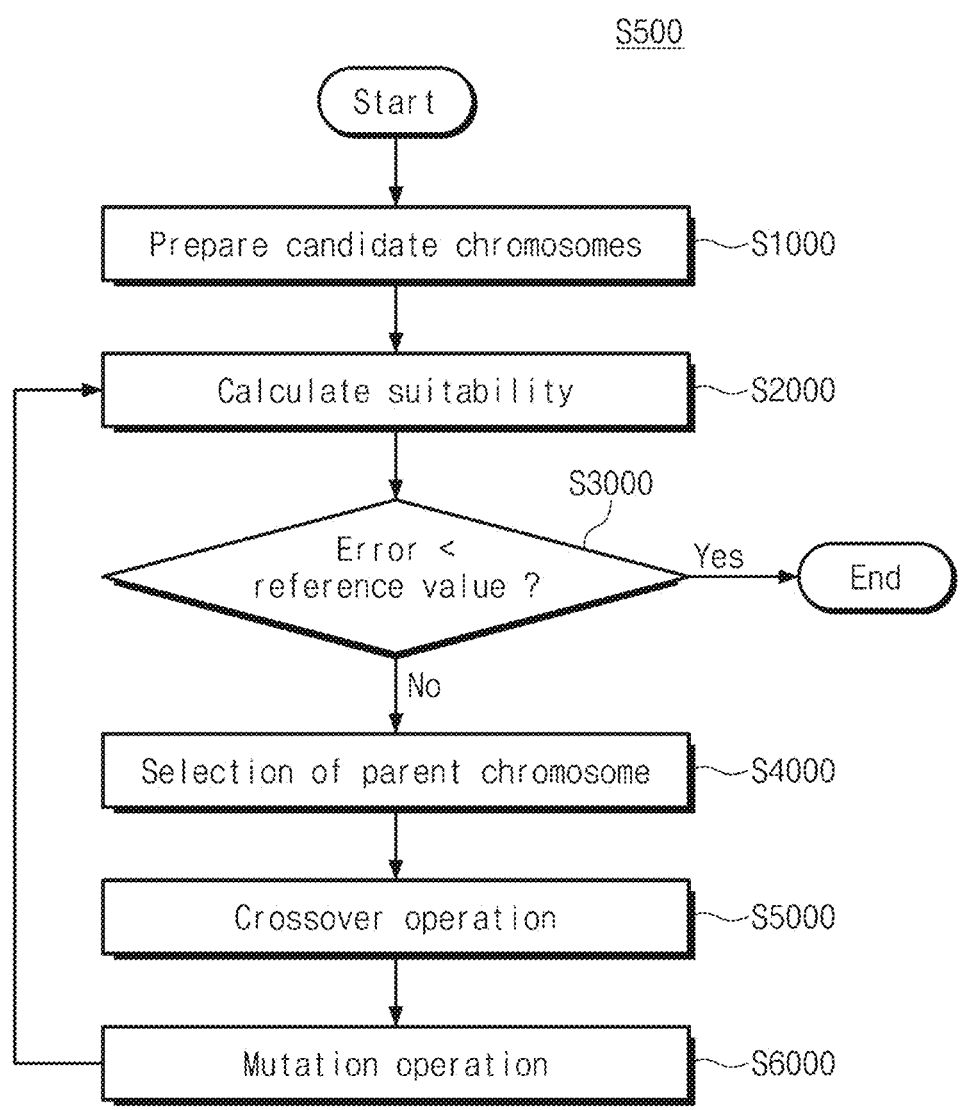

FIGS. 9, 10, and 12 are flow charts illustrating an OPC process according to some example embodiments and some steps thereof. FIGS. 11A to 11D are conceptual diagrams illustrating an image filtering process, which is performed as a part of an OPC process according to some example embodiments.

Referring to FIG. 9, the OPC process (in S30) according to some example embodiments may include forming an OPC model (in S31), correcting the OPC model based on a simulation result of the OPC model (in S32), and verifying the OPC model (in S33).

More specifically, referring to FIG. 10, the forming of the OPC model (in S31) may include obtaining a scanning electron microscope (SEM) image and a graphic data system (GDS) image (in S100), aligning the SEM image and the GDS image (in S200), performing an image filtering process (in S300), extracting a contour of the SEM image (in S400), and verifying the contour through a critical dimension (CD) matching process (in S500).

The SEM image may be an average, such as a median image, a mode image, or a mean image of a plurality of images obtained by imaging a pattern several times using a scanning electron microscope, and the GDS image may be an image that is obtained by extracting and/or imaging a previously-designed layout and performing a clipping process on the resulting image. The GDS image may be a computer-aided design (CAD) image. The aligning of the SEM and GDS images (in S200) may be executed in a manual and/or machine-learning manner.

Referring to FIGS. 11A to 11D, the image filtering process (in S300) may include forming a background image and extracting a result image based on the SEM image and the background image.

A first image IM1 of FIG. 11A may be referred to as the SEM image and may include a first pattern image PH. As an example, the first pattern image PH may include a black circle and a white band enclosing the black circle. The black circle may correspond to a top surface of a pattern, and the white band may correspond to an inclined sidewall of the pattern, e.g. to an inclined sidewall of the photoresist.

A second image IM2 of FIG. 11B may be referred to as the background image and may include a second pattern image PI2. The second image IM2 may be a binary image that is similar to, for example a negative of, the first image IM1. The second pattern image PI2 may have an indistinct outline.

A third image IM3 of FIG. 11C may be referred to as the result image and may include a third pattern image PI3. The third image IM3 may be formed by processing the first image IM1 and the second image IM2 using various methods (e.g., blending and/or smoothing methods). The third pattern image PI3 may have a clear outline. The contour of the SEM image may be extracted from the third pattern image PI3.

A fourth image IM4 of FIG. 11D may show the first image IM1, along with a contour CT. The fourth image IM4 may include a fourth pattern image PI4 and the contour CT, the fourth pattern image PI4 may be the same as the first pattern image PH, and the contour CT may surround the fourth pattern image PI4.

Referring to FIG. 12, the verifying of the contour through the CD matching process (in S500) may be performed using a genetic algorithm. The genetic algorithm may be a computational algorithm mimicking a natural evolution process in the natural world and thereby performing improvement, such as achieving a local or global optimization. By using the genetic algorithm, it may be possible to increase a probability that a solution with high suitability is chosen and to prevent or reduce the likelihood of and/or occurrence of the chosen solution from converging toward a poor local optimum point.

The verifying of the contour through the CD matching process (in S500) may include preparing candidate chromosomes (in S1000), calculating suitability of the candidate chromosomes (in S2000), determining termination of the process based on the result of the suitability calculation (in S3000), performing a parent chromosome selection (in S4000), a crossover operation (in S5000), and a mutation operation (in S6000) to form offspring chromosomes when or in response to the termination of the process is not required. After the formation of the offspring chromosomes, the calculation of the suitability (in S2000), the determination of the termination (in S3000), the parent chromosome selection (in S4000), the crossover operation (in S5000), and the mutation operation (in S6000) (when or in response to the process is not terminated) may be repeated until the process meets the termination condition.

Here, the chromosomes may represent solutions of a problem to be solved or improved upon, and genes included in each of the chromosomes may represent variables in the problem to be solved. In some example embodiments, the problem to be solved or improved upon may be a problem of finding a contour having an error value lower than a reference value or having improved accuracy and reliability, where the error value is, for example, a root-mean-square (rms) value of $\Delta CD_{matching}$ values given by the following formula 1.

In some example embodiments, the variables in the problem to be solved may be first parameters related to the image alignment process, second parameters related to the image filtering process, and/or third parameters related to the CD measurement process. The first parameters may include, for example, displacements of a SEM image, which are moved in a first and second direction, e.g. in the x and y directions, during the image alignment process. The second parameters may be related to a processing method in the image filtering process. For example, the second parameters may include at least one of a mixing rate, a contrast intensity, and a threshold value. The third parameters may include, for example, the number and/or positions of pixels which are selected when a mean value of CD values is calculated.

$$\Delta CD_{matching} = CD_{contour} - CD_{ref},\quad \text{[Formula 1]}$$

where $CD_{contour}$ is a CD value that is measured from the contour extracted by the method described with reference to FIGS. 11A to 11D, and $CD_{ref}$ is a reference CD value that is measured by a measurement device. The value of $CD_{ref}$ may be a target value of CD. As used herein, the CD may mean or correspond to a width of a pattern, which is selected as a target, and/or a distance between patterns facing each other.

In the determination of the termination (in S3000), if an error value, which is represented as a rms value of $\Delta CD_{matching}$ values, is smaller than a particular predetermined or dynamically determined reference value (i.e., Yes), the algorithm may be terminated, whereas if the error value is larger than or equal to the reference value (i.e., No), the algorithm may be continued. In the case where the termination condition is satisfied, a solution, such as an improved or optimal solution, may be extracted. For example, a contour having an error value lower than the reference value may be output.

Figure 13:
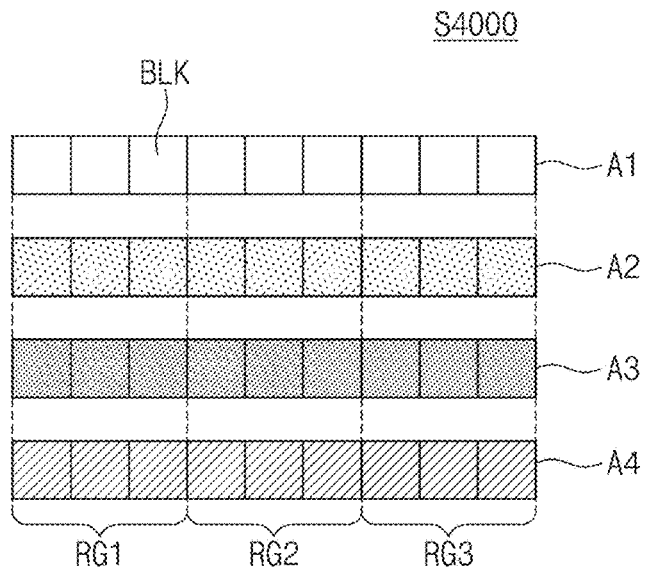
FIGS. 13 to 15 are conceptual diagrams illustrating a genetic algorithm, which is used for a method of forming an OPC model according to some example embodiments.
Figure 14:
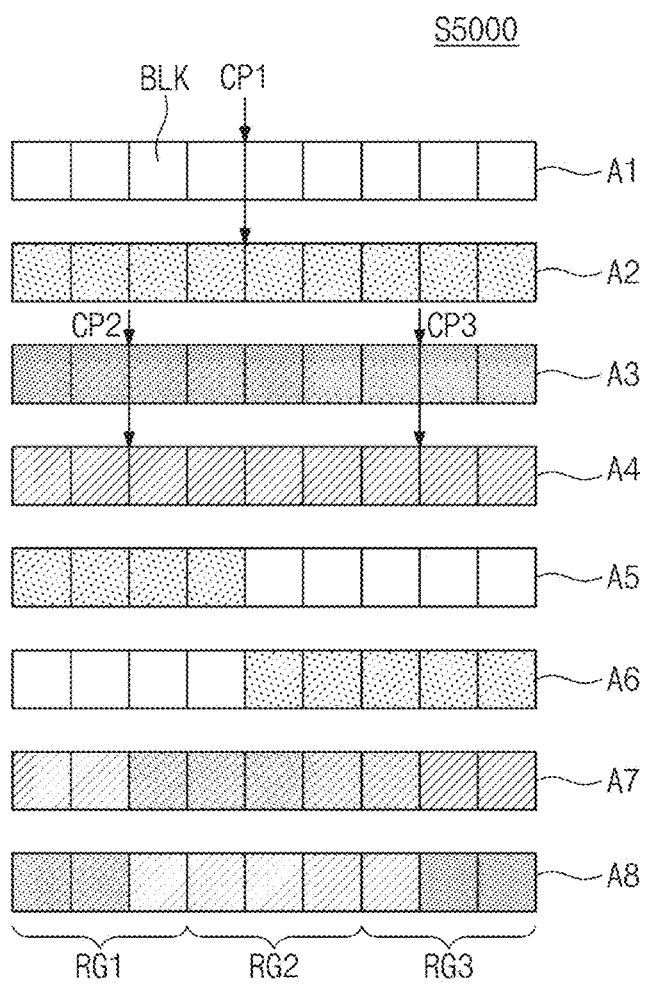
Figure 15:
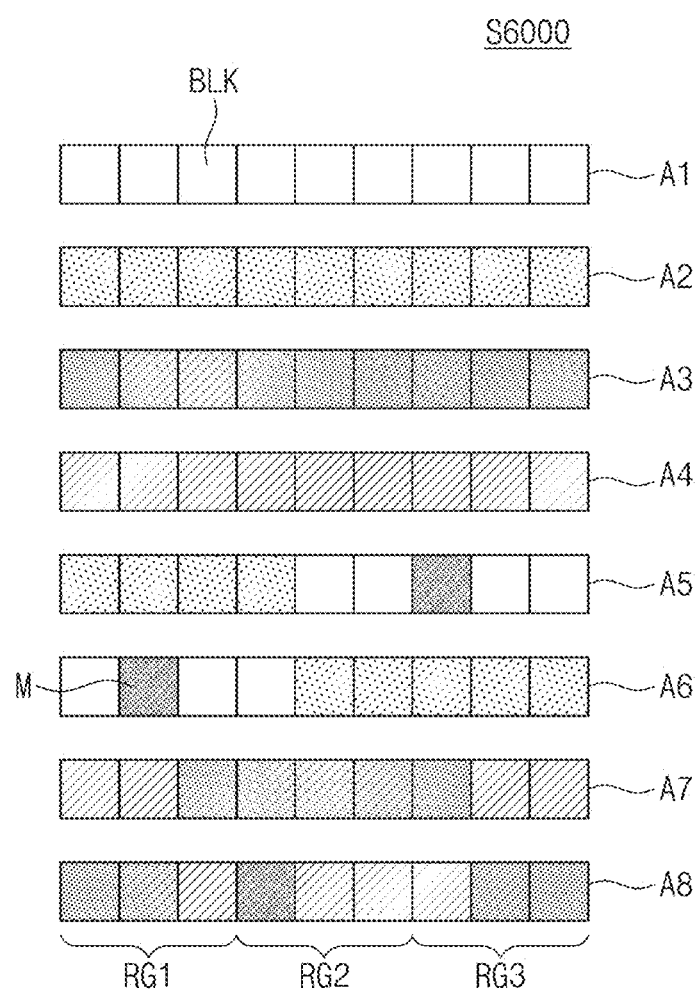

FIGS. 13 to 15 are conceptual diagrams illustrating a genetic algorithm, which is used for a method of forming an OPC model according to some example embodiments. Each of the number of chromosomes, the number of genes in each of the chromosomes, positions and the number of crossover points, positions and the number of mutations, a method of the crossover operation, and a method of the mutation operation to be described below are just examples, and example embodiments are not limited to these examples.

Referring to FIG. 13, first to fourth chromosomes A1, A2, A3, and A4 may be selected by the parent chromosome selection S4000. Each of the first to fourth chromosomes A1, A2, A3, and A4 may include a plurality of gene blocks BLK. Each of the gene blocks BLK may include different variables from each other.

Each of the first to fourth chromosomes A1, A2, A3, and A4 may include at least two regions. As an example, each of the first to fourth chromosomes A1, A2, A3, and A4 may include a first region RG1, a second region RG2, and a third region RG3. The gene blocks BLK which are located in the first region RG1, may include first variables, the gene blocks BLK which are located in the second region RG2, may include second variables, and the gene blocks BLK which are located in the third region RG3, may include third variables. For example, the first variables may be first parameters that are related to the image alignment process, the second variables may be second parameters that are related to the image filtering process, and the third variables may be third parameters that are related to the CD measurement process.

Referring to FIG. 14, offspring chromosomes may be formed by the crossover operation S5000. More specifically, fifth to eighth chromosomes A5, A6, A7, and A8, which are offsprings of the first to fourth chromosomes A1, A2, A3, and A4, may be formed by the crossover operation S5000. For example, the fifth and sixth chromosomes A5 and A6 may be the offsprings of the first and second chromosomes A1 and A2, and the seventh and eighth chromosomes A7 and A8 may be the offsprings of the third and fourth chromosomes A3 and A4.

The offspring chromosomes may be formed by setting a crossover point in parent chromosomes, and exchanging the gene blocks BLK, which are located on a side of the crossover point, in the parent chromosomes. Crossover points may be randomly, or dynamically, determined; however, example embodiments are not limited thereto.

For example, a first crossover point CP1 may be set between the fourth and fifth blocks from left to right in the first and second chromosomes A1 and A2, and the fifth and sixth chromosomes A5 and A6 may be formed by exchanging the gene blocks BLK, which are located on the left of the first crossover point CP1. As another example, a second crossover point CP2 and a third crossover point CP3 may be respectively set between the second and third blocks and between the seventh and eighth blocks from left to right in the third and fourth chromosomes A3 and A4, and the seventh and eighth chromosomes A7 and A8 may be formed by exchanging the gene blocks BLK which are located on the left of the second crossover point CP2, and the gene blocks BLK which are located on the right of the third crossover point CP3.

Referring to FIG. 15, at least one of the gene blocks BLK of the first to eighth chromosomes A1 to A8 may be replaced with a mutation gene block M by the mutation operation S6000. The mutation gene block M may include a variable having a value that is different from a variable included in a gene block before occurrence of mutation. The at least one of the gene blocks BLK of the first to eight chromosomes A1 to A8 that is replaced may be determined randomly or dynamically; however, example embodiments are not limited thereto.

Referring to FIG. 15 in conjunction with FIG. 12, chromosomes with low suitability may be removed from a group including the parent and offspring chromosomes, and new parent chromosomes may be selected. The afore-described process may be repeated until a sufficient solution, e.g. an improved or optimal solution is obtained, and/or an output contour has an error value smaller than a reference value. The iteration number of the afore-described process may be about 100 to 500; however, example embodiments are not limited thereto.

Figure 16A:
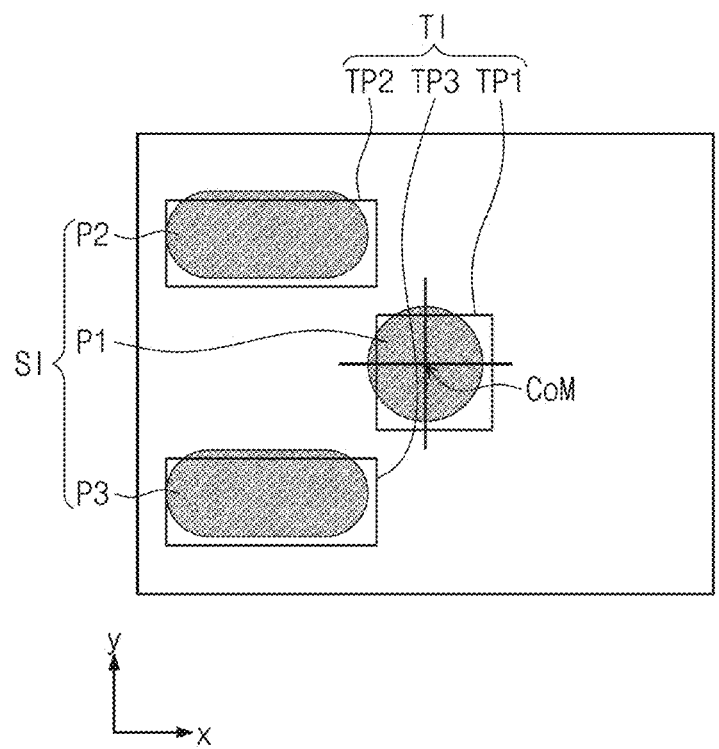
FIGS. 16A, 16B, 17A, and 17B are conceptual diagrams concretely illustrating some steps in a method of forming an OPC model according to some example embodiments.
Figure 16B:
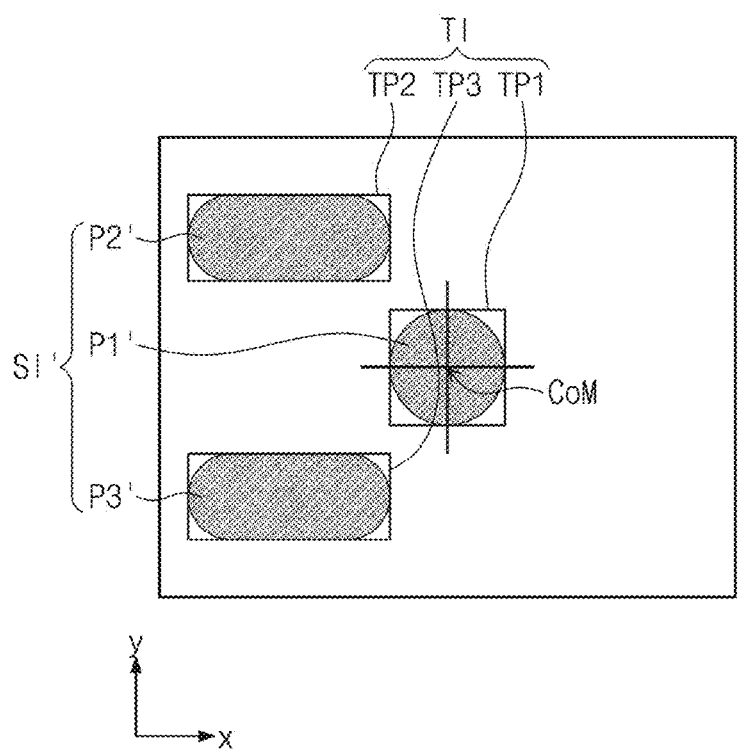
Figure 17A:
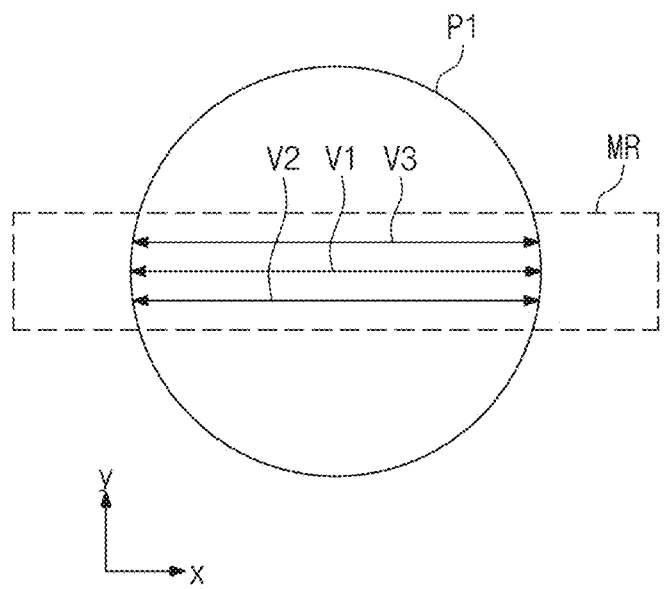
Figure 17B:
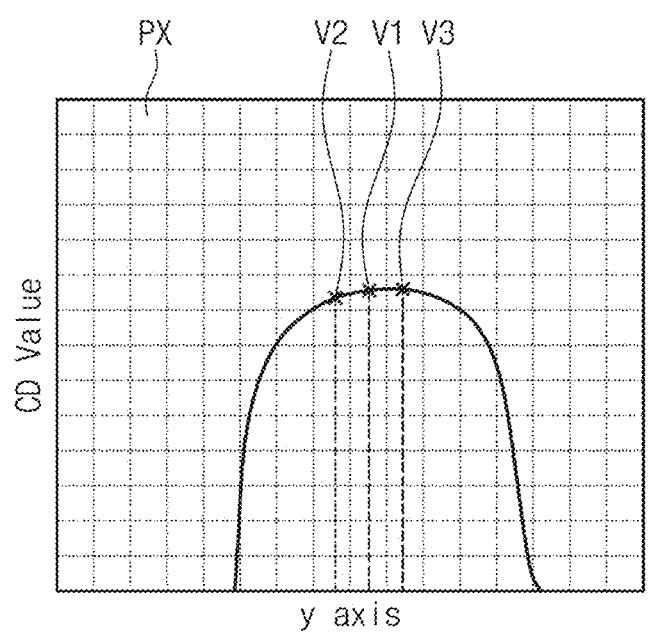

FIGS. 16A, 16B, 17A, and 17B are conceptual diagrams concretely illustrating some steps in a method of forming an OPC model according to some example embodiments. More specifically, FIGS. 16A and 16B are conceptual diagrams illustrating the image alignment process, and FIGS. 17A and 17B are conceptual diagram illustrating the CD measurement process.

Referring to FIGS. 16A and 16B, the image alignment process may be performed to align a SEM image SI and or with a GDS image TI. The SEM image SI may include, for example, first to third patterns P1, P2, and P3. The first pattern P1 may be located at a center portion of the SEM image SI. The first to third patterns P1, P2, and P3 may be spaced apart from each other.

In some example embodiments, the GDS image TI may include first to third target patterns TP1, TP2, and TP3. The first to third target patterns TP1, TP2, and TP3 may be adjacent to the first to third patterns P1, P2, and P3, respectively. Each of the first to third target patterns TP1, TP2, and TP3 may have a polygonal shape with a plurality of vertices. At least a portion of each of the first to third patterns P1, P2, and P3 may be placed outside a corresponding one of the first to third target patterns TP1, TP2, and TP3. For example, the first to third patterns P1, P2, and P3 may be dislocated from the first to third target patterns TP1, TP2, and TP3.

A SEM image SI' may be aligned to the GDS image TI by moving the SEM image SI relative to a center of mass (CoM) of the first pattern P1 in a first (x) direction and/or a second (y) direction. Accordingly, first to third patterns P1', P2', and P3' may be located within the first to third target patterns TP1, TP2, and TP3.

Referring to FIGS. 17A and 17B, a CD of the first pattern P1 shown in FIGS. 16A and 16B may be measured. The CD measurement process may be performed in a multi-point manner. For example, the CD measurement process may be performed at a plurality of positions in a measurement range (MR). First to third CD values V1, V2, and V3 may be CD values, in an x direction, of the first pattern P1 that are measured at different positions. For example, the measurement of the first to third CD values V1, V2, and V3 may be performed on each pixel Px whose distance in the y direction is uniform. The first CD value V1 may be measured from the pixel Px including the center of mass (e.g., see CoM of FIGS. 16A and 16B) of the first pattern P1 and may be larger than either or both of the second and third CD values V2 and V3.

As an example, the CD of the first pattern P1 may be given as the first CD value V1. As another example, the CD of the first pattern P1 may be given as an average value, such as a mean value or a median value or a mode value, of the first to third CD values V1, V2, and V3. As other example, the CD of the first pattern P1 may be given as an average value of four or more CD values including the first CD value V1.

The first parameters, which are related to the image alignment process described with reference to FIGS. 16A and 16B, and the third parameters, which are related to the CD measurement process described with reference to FIGS. 17A and 17B, may be variables in the genetic algorithm finding a contour having an error value smaller than the reference value and/or having improved accuracy and/or reliability.

Figure 18A:
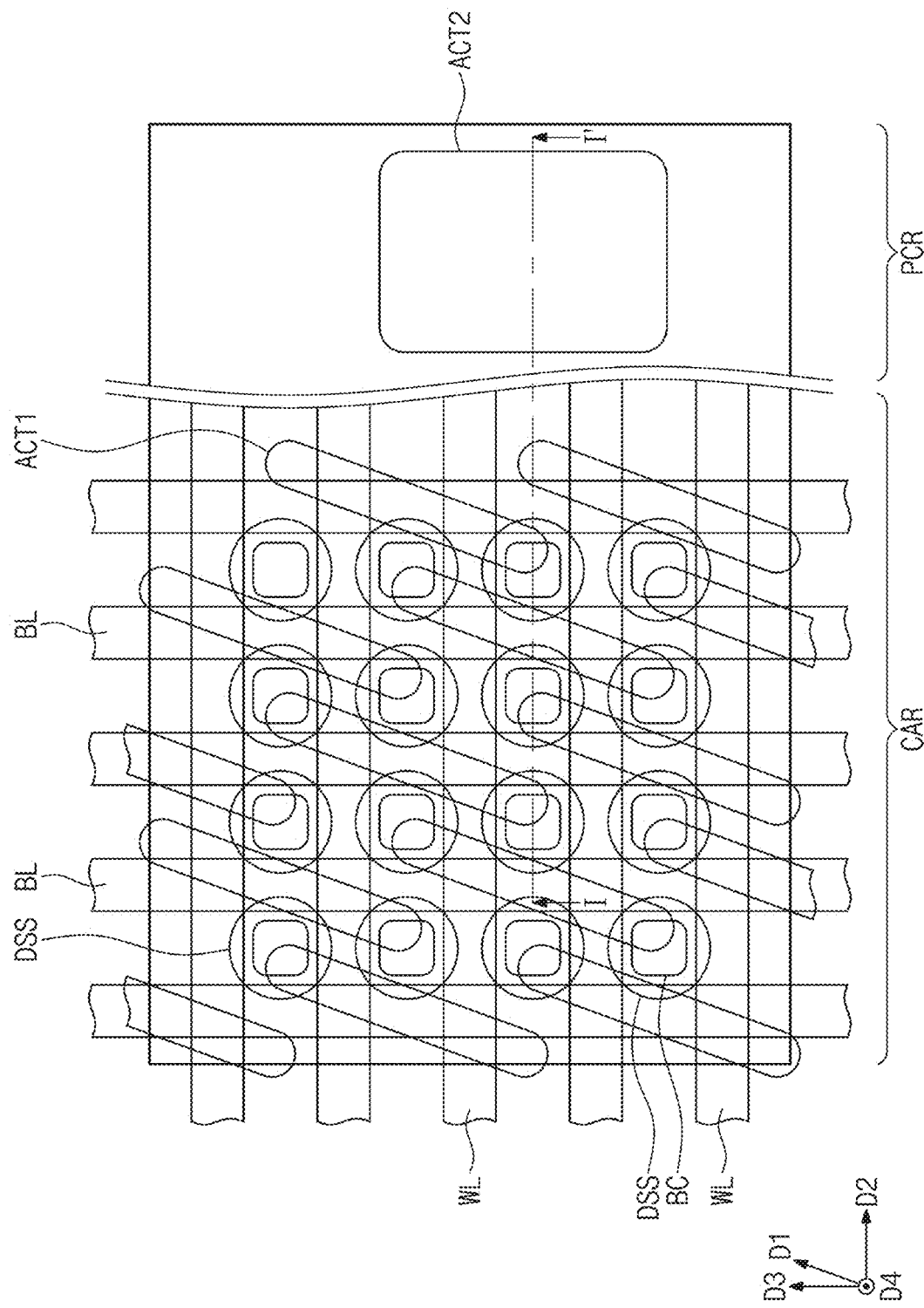
FIGS. 18A and 19A are plan views illustrating a method of forming an OPC model according to some example embodiments, a method of fabricating a semiconductor device using the same, and a semiconductor device fabricated by this method.
Figure 18B:
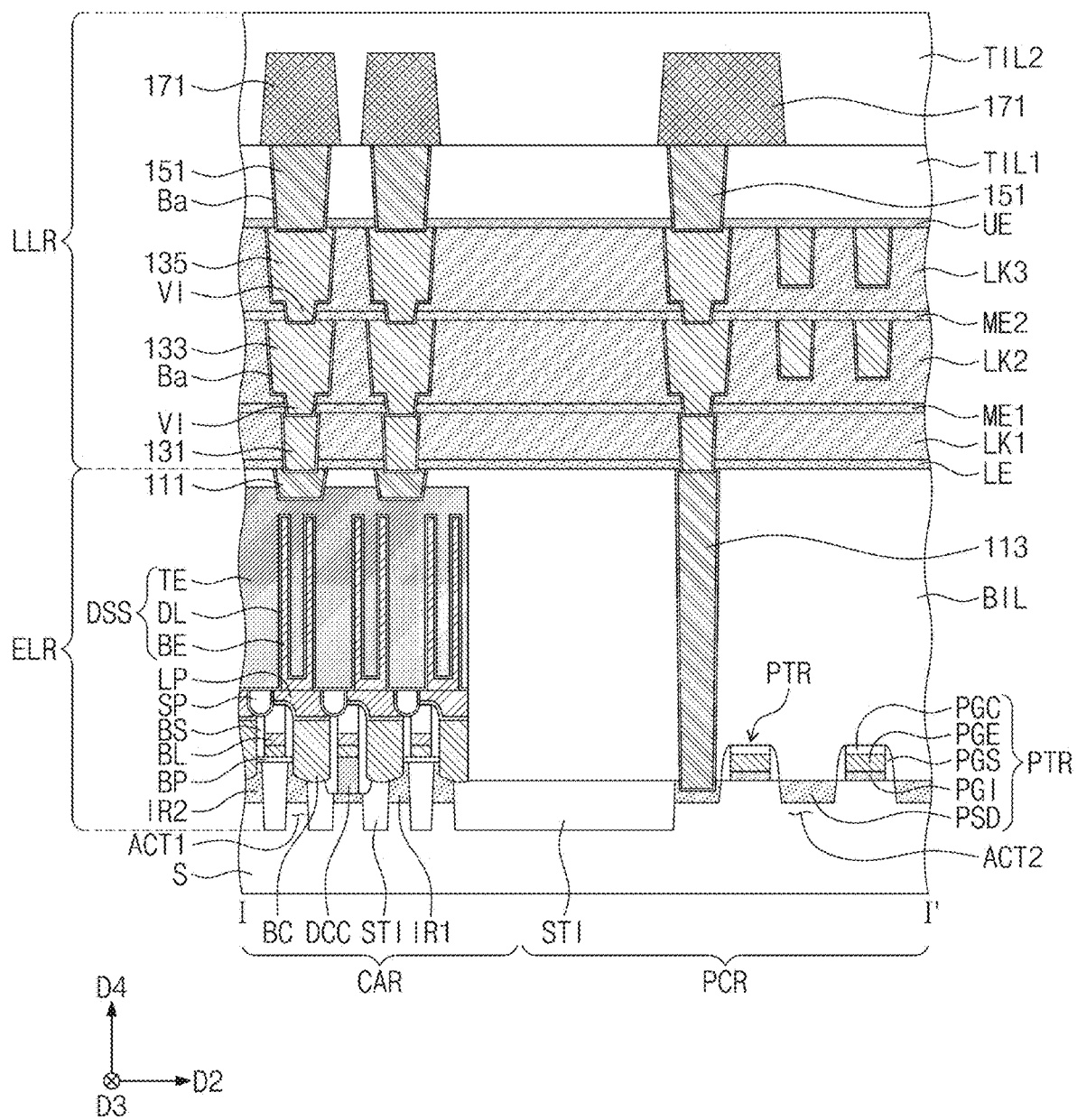
FIGS. 18B and 19B are sectional views illustrating a method of forming an OPC model according to some example embodiments, a method of fabricating a semiconductor device using the same, and a semiconductor device fabricated by this method and corresponding to sections respectively taken along a line I-I' of FIG. 18A and a line II-II' of FIG. 19A.

FIG. 18A is a plan view illustrating a method of forming an OPC model according to some example embodiments, a method of fabricating a semiconductor device using the same, and a semiconductor device fabricated by this method. FIG. 18B is a sectional view illustrating a method of forming an OPC model according to some example embodiments, a method of fabricating a semiconductor device using the same, and a semiconductor device fabricated by this method and corresponding to a section taken along a line I-I' of FIG. 18A.

Referring to FIGS. 18A and 18B, a semiconductor device according to some example embodiments may include an integrated circuit region ELR on a substrate S and an interconnection region LLR on the integrated circuit region ELR. The integrated circuit region ELR may be a region, which is provided on the substrate S and includes a plurality of transistors and/or a plurality of circuits, for example arranged as standard cells. The interconnection region LLR may be a region, on which a plurality of interconnection lines connected to the transistors and/or the circuits are provided.

In a case where the semiconductor device is or includes a memory device, the integrated circuit region ELR may include a cell array structure, which is provided on a cell array region CAR, and peripheral circuits, which are provided on a peripheral circuit region PCR and are configured to drive the cell array structure. The cell array structure may include cell transistors CTR, and the peripheral circuits may include peripheral transistors PTR. In some example embodiments, the peripheral circuit region PCR may be provided to enclose the cell array region CAR.

The cell array region CAR may be a region, on which memory cells are disposed. The peripheral circuit region PCR may be a region, on which one or more of a word line driver, a sense amplifier, row and column decoders, and other control circuits are disposed.

The integrated circuit region ELR on the cell array region CAR may include first active regions ACT1, which are defined by/surrounded by a device isolation layer STI on the substrate S, the cell transistors CTR, which are provided on the first active regions ACT1, and a data storage structure DSS, such as a capacitor or a memristor, which is connected to the cell transistor CTR.

The substrate S may be a semiconductor substrate formed of silicon, germanium, or silicon germanium. Each of the first active regions ACT1, which are provided in an upper portion of the substrate S, may have a horizontally-isolated bar shape, and may be extended in a first direction D1 parallel to a top surface of the substrate S. The first direction D1 may be a direction that is non-perpendicular to both of a second direction D2 and a third direction D3, which are parallel to the top surface of the substrate S. First impurity regions IR1 and second impurity regions IR2 may be provided in the first active regions ACT1. The first impurity regions IR1 and the second impurity regions IR2 may have a conductivity type that is different from the substrate S; however, example embodiments are not limited thereto.

A pair of word lines WL may be provided on each of the first active regions ACT1. The word lines WL may be buried in an upper portion of the substrate S and may be extended in the second direction D2 to cross the first active regions ACT1. The word lines WL may be spaced apart from each other in the third direction D3.

A buffer pattern BP may be provided on the top surface of the substrate S. The buffer pattern BP may be formed of or include at least one of insulating materials and may have a single- or multi-layered structure. Bit line contacts DCC may be provided on the first active regions ACT1. The bit line contacts DCC may be provided to penetrate the buffer pattern BP and may extend in a fourth direction D4 perpendicular to the top surface of the substrate S. The bit line contacts DCC may be connected to the first impurity regions IR1, respectively.

Bit lines BL may be provided to cross the word lines WL or to extend in the third direction D3. The bit lines BL may be spaced apart from each other in the second direction D2. The bit lines BL may be provided to cross a plurality of the first active regions ACT1. The bit lines BL may be in contact with the buffer pattern BP and the bit line contacts DCC. Each of the bit lines BL may include a first conductive pattern, a second conductive pattern, and a capping pattern, which are sequentially stacked. Spacers BS may be provided to cover opposite side surfaces of the first and second conductive patterns and the capping pattern. Node contacts BC, which are connected to the data storage structure DSS, may be provided between adjacent ones of the bit lines BL. The node contacts BC may be connected to the second impurity regions IR2, respectively.

Landing pads LP may be provided on the node contacts BC. The landing pads LP may be separated from each other by a separation pattern SP. The data storage structure DSS may be provided on each of the landing pads LP. In some example embodiments, the data storage structure DSS may be a capacitor or a memristor; however, example embodiments are not limited thereto. The data storage structure DSS may include a bottom electrode BE, a top electrode TE, and a dielectric layer DL between the bottom electrode BE and the top electrode TE. Although not shown, the data storage structure DSS may further include supporting patterns that are used to support side walls of the bottom electrode BE.

In some example embodiments, the bottom electrode BE of the data storage structure DSS may have a pillar shape or a cylinder shape with a closed bottom surface. The bottom electrode BE may be formed of or include at least one of, for example, doped polysilicon, metallic materials, metal nitride materials, metal silicide materials, or poly silicide. The dielectric layer DL may be formed to conformally cover the bottom electrode BE. The dielectric layer DL may be formed of or include at least one of oxides, nitrides, silicides, oxynitrides, or silicon oxynitrides, which contains one of hafnium (Hf), aluminum (Al), zirconium (Zr), or lanthanum (La). The top electrode TE may cover the dielectric layer DL. In the case where the bottom electrode BE has a cylinder shape with a closed bottom surface, the top electrode TE may be provided to fill an inner space of the cylindrical bottom electrode BE. In some example embodiments, the top electrode TE may be formed of or include doped silicon germanium.

The above description refers to an example in which the integrated circuit region ELR on the cell array region CAR includes a dynamic random access memory (DRAM), but example embodiments are not limited to this example. For example, the semiconductor device may include a memory device including a variable resistance element (e.g., a phase change material).

The integrated circuit region ELR on the peripheral circuit region PCR may include a second active region ACT2, which is defined by the device isolation layer STI, and the peripheral transistors PTR, which are provided on the second active region ACT2. Each of the peripheral transistors PTR may include a peripheral gate insulating layer PGI, a peripheral gate electrode PGE, and a peripheral capping pattern PGC, which are sequentially stacked on the second active region ACT2. Each of the peripheral transistors PTR may further include peripheral gate spacers PGS, which are provided to cover both side surfaces of the peripheral gate insulating layer PGI, the peripheral gate electrode PGE, and the peripheral capping pattern PGC, and peripheral source/drain regions PSD, which are provided at both sides of the peripheral gate electrode PGE.

A lower insulating layer BIL may be provided to cover the peripheral transistors PTR on the peripheral circuit region PCR and the data storage structure DSS on the cell array region CAR. The lower insulating layer BIL may be formed of or include at least one of, for example, silicon oxide, silicon nitride, or silicon oxynitride.

The formation of the integrated circuit region ELR on the cell array region CAR of the semiconductor device may include forming the first active regions ACT1 on the substrate S, forming the word lines WL and forming the bit lines BL on the first active regions ACT1, forming the bit line contacts DCC between the first active regions ACT1 and the bit lines BL, forming the node contacts BC adjacent to both sides of each of the bit lines BL, and forming the data storage structure DSS on each of the node contacts BC. Here, a photoresist pattern may define openings, in which the bit line contacts DCC and the node contacts BC will be formed, and the photoresist pattern may be formed by the afore-described OPC model forming method.

The interconnection region LLR on the integrated circuit region ELR may include insulating layers, low-k dielectric layers, and interconnection layers formed therein. For example, the interconnection region LLR may include first to third low-k dielectric layers LK1, LK2, and LK3, which are sequentially stacked, and first and second upper insulating layers TIL1 and TIL2, which are sequentially stacked on the third low-k dielectric layer LK3. A first lower interconnection layer 131, a second lower interconnection layer 133, and a third lower interconnection layer 135 may be provided in the first low-k dielectric layer LK1, the second low-k dielectric layer LK2, and the third low-k dielectric layer LK3, respectively. However, example embodiments are not limited to this example, and the number of the low-k dielectric layers and the number of the lower interconnection layers may be variously changed.

As used herein, the low-k dielectric layer may be an insulating layer whose dielectric constant is smaller than 4.4. For example, the first to third low-k dielectric layers LK1, LK2, and LK3 may be formed of or include SiCOH. In some example embodiments, the first to third lower interconnection layers 131, 133, and 135 may be formed of or include copper (Cu) and/or tungsten (W). Each of the second and third lower interconnection layers 133 and 135 may include a via VI, which is provided on a bottom surface of a line-shaped structure extended in a specific direction.

A portion of the first lower interconnection layer 131 on the cell array region CAR may be connected to an upper portion of the data storage structure DSS (e.g., the top electrode TE of the capacitors) through a first lower contact 111. A portion of the first lower interconnection layer 131 on the peripheral circuit region PCR may be connected to one of the peripheral source/drain regions PSD of the peripheral transistors PTR through a second lower contact 113. A bottom surface of the second lower contact 113 may be located at a level lower than a bottom surface of the first lower contact 111. Top surfaces of the first and second lower contacts 111 and 113 may be located at substantially the same level. The first and second lower contacts 111 and 113 may be formed of or include at least one of tungsten (W), titanium (Ti), tantalum (Ta), or nitrides thereof.

A lower interface layer LE may be provided between the first low-k dielectric layer LK1 and the lower insulating layer BIL. An upper interface layer UE may be provided between the third low-k dielectric layer LK3 and the first upper insulating layer TILE First and second intermediate interface layers ME1 and ME2 may be provided between the first to third low-k dielectric layers LK1, LK2, and LK3. Each of the lower interface layer LE, the upper interface layer UE, and the first and second intermediate interface layers ME1 and ME2 may be formed of or include, for example, silicon nitride and/or silicon carbon nitride.

The first and second upper insulating layers TIL1 and TIL2 may be provided on the third low-k dielectric layer LK3. The first and second upper insulating layers TIL1 and TIL2 may be formed of or include at least one of silicon oxide, silicon nitride, or silicon oxynitride.

An upper contact 151 may be provided in the first upper insulating layer TILE The upper contact 151 may be provided to penetrate the first upper insulating layer TIL1 and the upper interface layer UE and to be in contact with the third lower interconnection layer 135. The upper contact 151 may be electrically connected to the first to third lower interconnection layers 131, 133, and 135 and the first and second lower contacts 111 and 113. Upper interconnection layers 171 may be provided in the second upper insulating layer TIL2. The upper interconnection layers 171 may be in contact with a top surface of the upper contact 151.

The upper contact 151 may be provided to penetrate the first upper insulating layer TIL1 and may connect each of the upper interconnection layers 171 to the third lower interconnection layer 135. In some example embodiments, the upper contact 151 may be formed of or include at least one of tungsten (W), titanium (Ti), tantalum (Ta), or nitrides thereof. The upper interconnection layers 171 may be formed of or include a conductive material that is different from the first to third lower interconnection layers 131, 133, and 135. For example, the first to third lower interconnection layers 131, 133, and 135 may include a first metal, and the upper interconnection layers 171 may include a second metal different from the first metal. As an example, the upper interconnection layers 171 may be formed of or include aluminum (Al).

At least one of the first and second lower contacts 111 and 113, the first to third lower interconnection layers 131, 133, and 135, the upper contact 151, and the upper interconnection layers 171 may include a barrier layer Ba. The barrier layer Ba may be provided on bottom and side surfaces of at least a portion of the first and second lower contacts 111 and 113, the first to third lower interconnection layers 131, 133, and 135, the upper contact 151, and the upper interconnection layers 171. The barrier layer Ba may be formed of or include a conductive metal nitride material (e.g., titanium nitride (TiN) and/or tantalum nitride (TaN)).

Figure 19A:
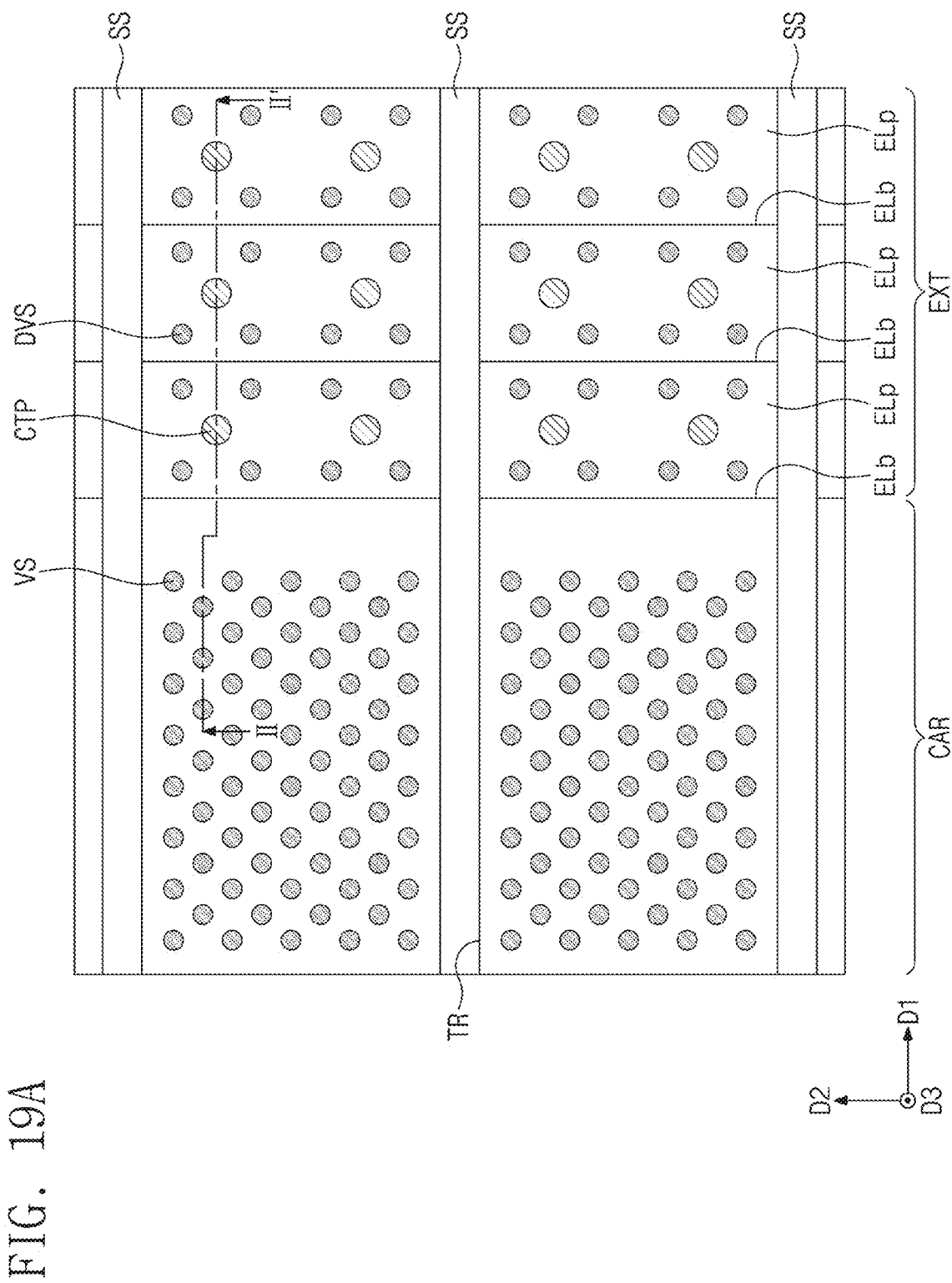
Figure 19B:
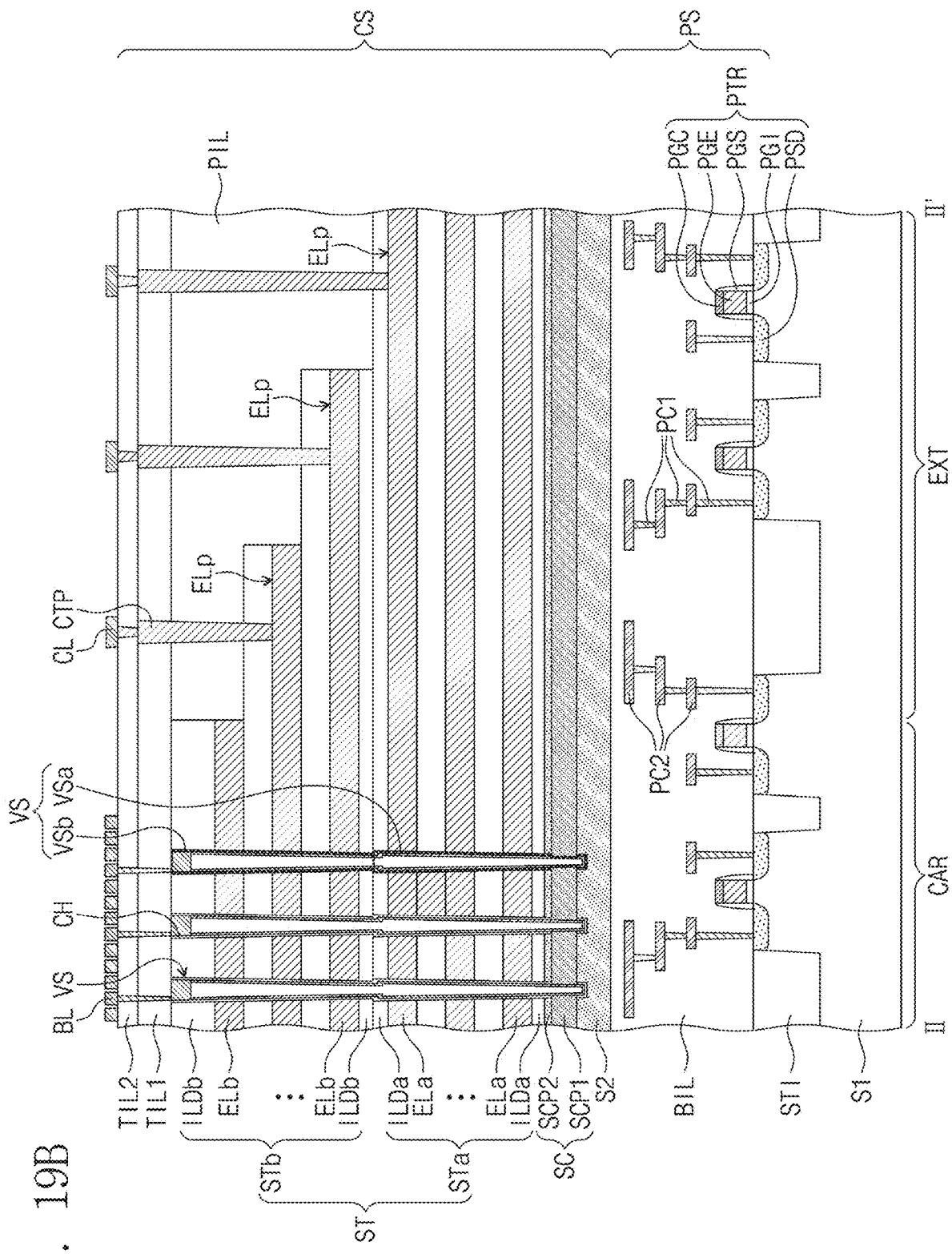

FIG. 19A is a plan view illustrating a method of forming an OPC model according to some example embodiments, a method of fabricating a semiconductor device using the same, and a semiconductor device fabricated by this method. FIG. 19B is a sectional view illustrating a method of forming an OPC model according to some example embodiments, a method of fabricating a semiconductor device using the same, and a semiconductor device fabricated by this method and corresponding to a section taken along a line II-II' of FIG. 19A.

Referring to FIGS. 19A and 19B, a first substrate S1 including the cell array region CAR and an extension region EXR may be provided. The first substrate S1 may be extended in a first direction D1 from the cell array region CAR toward the extension region EXR and in a second direction D2 crossing the first direction D1. A top surface of the first substrate S1 may be perpendicular to a third direction D3 that is not parallel to the first and second directions D1 and D2. For example, the first, second, and third directions D1, D2, and D3 may be orthogonal to each other.

The extension region EXR may be extended from the cell array region CAR in the first direction D1. Vertical channel structures VS to be described below may be provided on the cell array region CAR. A staircase structure, which includes pad portions ELp to be described below, may be provided on the extension region EXR.

In some example embodiments, the first substrate S1 may be a silicon substrate, a silicon germanium substrate, a germanium substrate, or a single crystalline epitaxial layer grown on a single-crystalline silicon substrate. A device isolation layer STI may be provided in the first substrate S1. The device isolation layer STI may define an active region of the first substrate S1. The device isolation layer STI may be formed of or include, for example, silicon oxide.

A peripheral circuit structure PS may be provided on the first substrate S1. The peripheral circuit structure PS may include peripheral circuit transistors PTR, which are provided on the active region of the first substrate S1, peripheral circuit contact plugs PC1, peripheral circuit interconnection lines PC2, which are electrically connected to the peripheral circuit transistors PTR through the peripheral circuit contact plugs PC1, and a lower insulating layer BIL enclosing them.

The peripheral circuit transistors PTR, the peripheral circuit contact plugs PC1, and the peripheral circuit interconnection lines PC2 may constitute a peripheral circuit. For example, the peripheral circuit transistors PTR may constitute a decoder circuit, a page buffer, a logic circuit, and so forth. More specifically, each of the peripheral circuit transistors PTR may include a peripheral gate insulating layer PGI, a peripheral gate electrode PGE, a peripheral capping pattern PGC, peripheral gate spacers PGS, and peripheral source/drain regions PSD.

The peripheral circuit interconnection lines PC2 may be electrically connected to the peripheral circuit transistors PTR through the peripheral circuit contact plugs PC1. In some example embodiments, each of the peripheral circuit transistors PTR may be a planar transistor such as a planar NMOS transistor or a PMOS transistor, or may be a gate-all-around type transistor. For example, the peripheral circuit contact plugs PC1 may have an increasing width with increasing distance from the first substrate S1. The peripheral circuit contact plugs PC1 and the peripheral circuit interconnection lines PC2 may be formed of or include at least one of conductive materials (e.g., metallic materials).

The lower insulating layer BIL may be provided on the top surface of the first substrate S1. The lower insulating layer BIL may be provided on the first substrate S1 to cover the peripheral circuit transistors PTR, the peripheral circuit contact plugs PC1, and the peripheral circuit interconnection lines PC2. The lower insulating layer BIL may have a multi-layered structure including a plurality of insulating layers. For example, the lower insulating layer BIL may be formed of or include at least one of silicon oxide, silicon nitride, silicon oxynitride, and/or low-k dielectric materials.

A cell array structure CS may be provided on the peripheral circuit structure PS, and in some example embodiments, the cell array structure CS may include a second substrate S2, a stack ST, separation structures SS, the vertical channel structures VS, and contact plugs CTP. Hereinafter, the cell array structure CS will be described in more detail below.

The second substrate S2 may be provided on the cell array region CAR and the extension region EXR to cover the lower insulating layer BIL. The second substrate S2 may be extended in the first direction D1 and the second direction D2. The second substrate S2 may be a semiconductor substrate that is formed of or includes a semiconductor material. The second substrate S2 may be formed of or include at least one of silicon (Si), germanium (Ge), silicon germanium (SiGe), gallium arsenic (GaAs), indium gallium arsenic (InGaAs), or aluminum gallium arsenic (AlGaAs).

The stack structure ST may be provided on the second substrate S2. The stack structure ST may be extended from the cell array region CAR toward the extension region EXR in the first direction D1. In some example embodiments, a plurality of the stack structures ST, which are arranged in the second direction D2, may be provided. When viewed in a plan view, the separation structures SS may be provided in trenches TR, which are provided between the stack structures ST and are extended in the first direction D1. The separation structures SS may be extended from the cell array region CAR to the extension region EXR. The stack structures ST may be spaced apart from each other with one of the separation structures SS interposed therebetween, in the second direction D2.

For convenience in description, one of the stack structures ST and one of the separation structures SS will be described in more detail below, but the others of the stack structures ST and the others of the separation structures SS may be configured to have the same features.

The stack structure ST may include interlayer dielectric layers ILDa and ILDb and gate electrodes ELa and ELb, which are alternately and repeatedly stacked. More specifically, the stack structure ST may include a lower stack STa on the second substrate S2 and an upper stack STb on the lower stack STa. The lower stack STa may include first interlayer dielectric layers ILDa and first gate electrodes Ela, which are alternately and repeatedly stacked, and the upper stack STb may include second interlayer dielectric layers ILDb and second gate electrodes ELb, which are alternately and repeatedly stacked.

Lengths of the first and second gate electrodes ELa and ELb in the first direction D1 may decrease with increasing distance from the second substrate S2 (i.e., in the third direction D3). For example, the length of each of the first and second gate electrodes ELa and ELb in the first direction D1 may be larger than a length of another electrode thereon in the first direction D1. The lowermost one of the first gate electrodes ELa of the lower stack Sta may have the longest length in the first direction D1, and the uppermost one of the second gate electrodes ELb of the upper stack STb may have the shortest length in the first direction D1.

The first and second gate electrodes ELa and ELb may have the pad portions ELp on the extension region EXR. The pad portions ELp of the first and second gate electrodes ELa and ELb may be disposed at positions that are different from each other in horizontal and vertical directions. The pad portions ELp may form the staircase structure in the first direction D1.

Due to the staircase structure, each of the lower and upper stack structures STa and STb may have a decreasing thickness with increasing distance from the outermost one of the vertical channel structures VS, and when viewed in a plan view, side surface of the first and second gate electrodes ELa and ELb may be spaced apart from each other by a specific distance in the first direction D1.

The first and second gate electrodes ELa and ELb may be formed of or include at least one of, for example, doped semiconductor materials (e.g., doped silicon and so forth), metallic materials (e.g., tungsten, copper, aluminum, and so forth), conductive metal nitrides (e.g., titanium nitride, tantalum nitride, and so forth), or transition metals (e.g., titanium, tantalum, and so forth).

The first and second interlayer dielectric layers ILDa and ILDb may be provided between the first and second gate electrodes ELa and ELb. That is, lengths of the first and second interlayer dielectric layers ILDa and ILDb in the first direction D1 may decrease with increasing distance from the second substrate S2, similar to the first and second gate electrodes ELa and ELb.

The first and second interlayer dielectric layers ILDa and ILDb may be formed of or include at least one of, for example, silicon oxide, silicon nitride, silicon oxynitride, and/or low-k dielectric materials. For example, the first and second interlayer dielectric layers ILDa and ILDb may be formed of or include high density plasma (HDP) oxide or tetraethyl orthosilicate (TEOS).

A source structure SC may be provided between the second substrate S2 and the stack ST. The source structure SC may be extended parallel to the first and second gate electrodes ELa and ELb of the stack structure ST or in the first and second directions D1 and D2. The source structure SC may include a first source conductive pattern SCP1 and a second source conductive pattern SCP2 sequentially stacked. The second source conductive pattern SCP2 may be provided between the first source conductive pattern SCP1 and the lowermost one of the first interlayer dielectric layers ILDa. A thickness of the first source conductive pattern SCP1 may be larger than a thickness of the second source conductive pattern SCP2. Each of the first and second source conductive patterns SCP1 and SCP2 may include a doped semiconductor material. In some example embodiments, an impurity concentration of the first source conductive pattern SCP1 may be higher than an impurity concentration of the second source conductive pattern SCP2.

The vertical channel structures VS may be provided on the cell array region CAR to penetrate the stack structure ST and the source structure SC and to be in contact with the second substrate S2. Each of the vertical channel structures VS may be provided to penetrate at least a portion of the second substrate S2 and may have a bottom surface that is located at a level lower than the top surface of the second substrate S2 and the bottom surface of the source structure SC.

The vertical channel structures VS may be provided to form a zigzag arrangement in the first or second direction D1 or D2, when viewed in a plan view. The vertical channel structures VS may be provided in vertical channel holes CH, which are formed to penetrate the stack ST. Each of the vertical channel structures VS may include a lower vertical channel structure VSa, which is provided in a corresponding one of lower vertical channel holes penetrating the lower stack STa, and an upper vertical channel structure VSb, which is provided in a corresponding one of upper vertical channel holes penetrating the upper stack STb. The lower vertical channel structure VSa may be connected to the upper vertical channel structure VSb in the third direction D3.

A width of each of the upper and lower vertical channel structures VSa and VSb may increase with increasing distance from the second substrate S2 (i.e., in the third direction D3). In some example embodiments, the topmost width of the lower vertical channel structure VSa may be larger than the lowermost width of the upper vertical channel structure VSb. That is, a side surface of each of the vertical channel structures VS may have a stepwise shape adjacent to a boundary between the lower vertical channel structure VSa and the upper vertical channel structure VSb. However, the inventive concept is not limited to this example, and the side surface of each of the vertical channel structures VS may have three or more stepwise portions located at different levels or may have a flat shape without a stepwise portion, unlike that illustrated in the drawings.

Each of the vertical channel structures VS may include a data storage pattern, which is adjacent to the stack structure ST or covers an inner side surface of each of the vertical channel holes CH, a vertical semiconductor pattern, which is provided to conformally cover an inner side surface of the data storage pattern, a gapfill insulating pattern, which is provided to fill an internal space delimited by the vertical semiconductor pattern, and a conductive pad, which is provided in a space delimited by the gapfill insulating pattern and the data storage pattern. In some example embodiments, a top surface of each of the vertical channel structures VS may have a circular, elliptical, or bar shape.

A plurality of dummy vertical channel structures DVS may be provided on the extension region EXR to penetrate a planarization insulating layer PIL to be described below, the stack ST, and the source structure SC. More specifically, the dummy vertical channel structures DVS may be provided to penetrate the pad portions ELp of the first and second gate electrodes ELa and ELb. The dummy vertical channel structures DVS may be provided adjacent to the contact plugs CTP to be described below. The dummy vertical channel structures DVS may not be provided on the cell array region CAR. The dummy vertical channel structures DVS and the vertical channel structures VS may be formed at the same time and may have substantially the same structure. However, in some example embodiments, the dummy vertical channel structures DVS may not be provided.

The planarization insulating layer PIL may be provided on the extension region EXR to cover the staircase structure of the stack ST. The planarization insulating layer PIL may have a substantially flat top surface. The top surface of the planarization insulating layer PIL may be substantially coplanar with the uppermost surface of the stack structure ST (e.g., the top surface of the uppermost one of the second interlayer dielectric layers ILDb).

The first and second upper insulating layers TIL1 and TIL2 may be sequentially stacked on the stack structure ST and the planarization insulating layer PIL. Each of the first and second upper insulating layers TIL1 and TIL2 may be formed of or include at least one of insulating materials (e.g., silicon oxide, silicon nitride, silicon oxynitride, and/or low-k dielectric materials).

The separation structure SS may be provided to penetrate the first upper insulating layer TIL1, the stack ST, and the source structure SC. The separation structure SS may further penetrate the planarization insulating layer PIL on the extension region EXR. The separation structure SS may be spaced apart from the vertical channel structures VS in the second direction D2.

The contact plugs CTP may be provided on the extension region EXR to penetrate the first upper insulating layer TIL1 and the planarization insulating layer PIL. Each of the contact plugs CTP may further penetrate one of the interlayer dielectric layers ILDa and ILDb of the stack structures ST and may be in contact with and be electrically connected to one of the gate electrodes ELa and ELb. The contact plugs CTP may be provided on the pad portions ELp. The contact plugs CTP may be spaced apart from the dummy vertical channel structures DVS. A height of each of the contact plugs CTP in the third direction D3 may increase with increasing distance from the outermost one of the vertical channel structures VS. A width of each of the separation structures SS and the contact plugs CTP may increase with increasing distance from the second substrate S2 (i.e., in the third direction D3). The contact plugs CTP may be formed of or include at least one of conductive materials (e.g., metallic materials).

Bit lines BL, which are electrically connected to the vertical channel structures VS, and conductive lines CL, which are electrically connected to the contact plugs CTP, may be provided on the second upper insulating layer TIL2. The bit lines BL and the conductive lines CL may be formed of or include at least one of conductive materials (e.g., metallic materials).

In a process of fabricating a semiconductor device according to some example embodiments, the formation of the cell array structure CS on the cell array region CAR may include forming the stack structure ST on the second substrate S2 and forming the vertical channel structures VS in the vertical channel holes CH penetrating the stack ST. More specifically, the formation of the cell array structure CS may include alternately and repeatedly stacking the interlayer dielectric layers ILDa and ILDb and sacrificial layers on the second substrate S2, forming the vertical channel holes CH to penetrate the interlayer dielectric layers ILDa and ILDb and the sacrificial layers, forming the vertical channel structures VS to fill the vertical channel holes CH, forming the trench TR on the second substrate S2 to penetrate the interlayer dielectric layers ILDa and ILDb and the sacrificial layers, removing the sacrificial layers, which are exposed by the trench TR, and forming the gate electrodes ELa and ELb.

Here, a photoresist pattern may define openings, which are used to define the vertical channel structures VS (i.e., the vertical channel holes CH), and the photoresist pattern may be formed by the afore-described OPC model forming method.

In the semiconductor devices described with reference to FIGS. 18A, 18B, 19A, and 19B, patterns and contacts may be formed by the afore-described OPC model forming method. More specifically, by using the afore-described OPC model forming method, the patterns and contacts of the semiconductor device may be formed at predetermined or desired positions, and thus, it may be possible to fabricate a highly-reliable semiconductor device with improved accuracy. Especially, it may be possible to accurately form the bit line contacts DCC and the node contacts BC of the semiconductor device described with reference to FIGS. 18A and 18B and the vertical channel structures VS of the semiconductor device described with reference to FIGS. 19A and 19B at desired positions and thereby to improve electric characteristics of the semiconductor device.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In a method of forming an optical proximity correction OPC model according to some example embodiments and a method of fabricating a semiconductor device using the same, by extracting a contour having an error value lower than a predetermined reference value, it may be possible to improve accuracy, reliability, and/or electrical characteristics of a semiconductor device.

While various example embodiments of inventive concepts have been particularly shown and described, it will be understood by one of ordinary skill in the art that variations in form and detail may be made therein without departing from the spirit and scope of the attached claims. Furthermore, none of the variously described example embodiments are necessarily mutually exclusive with one another. For example, some example embodiments may include one or more features described with reference to one or more drawings, and may also include one or more features described with reference to one or more other drawings.

What is claimed is:

1. A method of forming an optical proximity correction (OPC) model, comprising:
   obtaining a scanning electron microscope (SEM) image and a graphic data system (GDS) image, the SEM image being an average image of a plurality of images taken using one or more scanning electron microscopes and the GDS image obtained from a designed layout;
   aligning the SEM image and the GDS image;
   performing an image filtering process on the SEM image;
   extracting a contour from the SEM image; and
   verifying the contour, wherein the verifying of the contour is performed using a genetic algorithm, and variables in the genetic algorithm comprise first parameters related to the aligning of the SEM image and the GDS image, second parameters related to the image filtering process, and third parameters related to a critical dimension (CD) measurement process.

2. The method of claim 1, wherein the verifying of the contour comprises:

preparing candidate solutions represented by chromosomes;

calculating suitability of the chromosomes;

determining termination of the verifying, based on the calculated suitability; and in response to the termination of the verifying not being determined, forming offspring chromosomes by performing a parent chromosome selection, a crossover operation, and a mutation operation.

3. The method of claim 2, wherein the termination of the verifying comprises determining whether a root-mean-square (rms) value of $\Delta CD_{matching}$ values given by the following formula 1 is smaller than a reference value, $$\Delta CD_{matching} = CD_{contour} - CD_{ref}, \quad \text{[Formula 1]}$$

where $CD_{contour}$ corresponds to a CD value measured from the contour, which is extracted from the SEM image, and $CD_{ref}$ corresponds to a reference CD value that is measured by a measurement device.

4. The method of claim 2, wherein the variables of the genetic algorithm are represented by gene blocks of the chromosomes.

5. The method of claim 1, wherein the aligning of the SEM image and the GDS image comprises moving the SEM image relative to a center of mass of a pattern, the center of mass located at a center portion of the SEM image.

6. The method of claim 5, wherein the first parameters include displacements of the SEM image, which are moved in a first direction and a second direction during the aligning of the SEM image and the GDS image.

7. The method of claim 1, wherein the image filtering process comprises forming a result image by processing the SEM image and a background image, the background image is a binary image.

8. The method of claim 7, wherein the contour is extracted from the result image.

9. The method of claim 7, wherein the second parameters are parameters that are related to a method of processing the SEM image and the background image.

10. The method of claim 9, wherein the second parameters comprise at least one of a mixing rate, a contrast intensity, and a threshold value.

11. The method of claim 1, wherein the CD measurement process comprises:

measuring CD values from a plurality of pixels in a measurement range;

selecting two or more of the plurality of pixels; and calculating an average value of the CD values measured from the two or more of the plurality of pixels.

12. The method of claim 11, wherein the third parameters include a number of and positions of the two or more of the plurality of pixels.

13. A method of fabricating a semiconductor device, comprising:

designing a layout;

performing an optical proximity correction (OPC) process on the designed layout to generate an OPC-corrected layout; and performing a photolithography process using a photomask, which is manufactured based on the OPC-corrected layout, to form photoresist patterns on a substrate, wherein the OPC process comprises, forming an OPC model, correcting the OPC model, based on a simulation result on the OPC model, and verifying the corrected OPC model, and wherein the forming of the OPC model comprises, obtaining an SEM image, which is an average image of a plurality of images on the photoresist patterns taken using one or more scanning electron microscopes, and obtaining a GDS image, which is obtained by imaging the layout, aligning the SEM image and the GDS image, performing an image filtering process on the SEM image, extracting a contour from the SEM image, and verifying the contour by using a genetic algorithm.

14. The method of claim 13, wherein the photolithography process is performed using extreme ultraviolet (EUV) light.

15. The method of claim 13, wherein variables of the genetic algorithm include first parameters related to the aligning of the SEM image and the GDS image, second parameters related to the image filtering process, and third parameters related to a process of measuring a critical dimension (CD) of a pattern.

16. The method of claim 15, wherein the first parameters include displacements of the SEM image, which are moved in first and second directions during the aligning of the SEM image and the GDS image, the second parameters include at least one of a mixing rate, a contrast intensity, and a threshold value, which are parameters related to a processing method in the image filtering process, and the third parameters include a number of and positions of pixels, which are selected in the CD measurement process.

17. The method of claim 15, wherein the aligning of the SEM image and the GDS image comprises moving the SEM image relative to a center of mass of a pattern, the center of mass located at a center portion of the SEM image.

18. The method of claim 13, wherein the verifying of the contour comprises:

preparing candidate solutions represented by chromosomes;

calculating suitability of the chromosomes;

determining termination of the verifying, based on the calculated suitability; and in response to the verifying not being terminated, forming offspring chromosomes by performing a parent chromosome selection, a crossover operation, and a mutation operation.

19. The method of claim 13, further comprising:

forming an active region on the substrate;

forming a word line crossing the active region;

forming a bit line intersecting the word line;

forming a bit line contact between the active region and the bit line;

forming a node contact adjacent to a first side of the bit line and a second side of the bit line; and forming a data storage structure on the node contact, wherein the photoresist patterns define openings, which are used to form the bit line contact and the node contact.

20. The method of claim 13, further comprising:
forming a stack structure including interlayer dielectric layers and gate electrodes, which are alternately and repeatedly stacked on the substrate; and
forming vertical channel structures in vertical channel holes penetrating the stack,
wherein the photoresist pattern defines openings, which are used to form the vertical channel holes.

* * * * *